US007935601B1

(12) United States Patent
Neudeck

(10) Patent No.: US 7,935,601 B1
(45) Date of Patent: May 3, 2011

(54) METHOD FOR PROVIDING SEMICONDUCTORS HAVING SELF-ALIGNED ION IMPLANT

(75) Inventor: Philip G. Neudeck, Ohmsted Falls, OH (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 131 days.

(21) Appl. No.: 12/584,497

(22) Filed: Sep. 4, 2009

(51) Int. Cl.
*H01L 21/336* (2006.01)
*H01L 21/337* (2006.01)
*H01L 21/331* (2006.01)
*H01L 21/425* (2006.01)
*H01L 21/22* (2006.01)
*H01L 21/38* (2006.01)

(52) U.S. Cl. ........ 438/285; 438/186; 438/364; 438/369; 438/514; 438/527; 438/542

(58) Field of Classification Search .......... 438/285, 438/186, 364, 369, 514, 527, 542
See application file for complete search history.

(56) References Cited

U.S. PATENT DOCUMENTS

| 5,953,632 | A | 9/1999 | Matsubara | |
|---|---|---|---|---|
| 6,168,983 | B1 * | 1/2001 | Rumennik et al. | 438/188 |
| 2009/0176343 | A1 * | 7/2009 | Shima et al. | 438/285 |

OTHER PUBLICATIONS

D.M. Brown et al entitled "*Silicon Carbide MOSFET Integrated Circuit Technology*" published in Physica Status Solidi (a), vol. 162, No. 1, pp. 459-479, Jul. 1997.

P.G. Neudeck et al entitled "*Stable Electrical Operation of 6H-Si JFET's and IC's for Thousands of Hours at 500° C*" published in IEEE Electron Device Letters, vol. 29, No. 5, May 2008.

P.G. Neudeck et al entitled "*6H-SiC Transistor Integrated Circuits Demonstrating Prolonged Operation at 500° C*" published in Proceedings 2008, IMAPS International High Temperatures Electronics Conference, pp. 95-102, May 2008.

Richard C. Jaeger "*Volume V Introduction to Microelectronic Fabrication*" published as part of the Modular Services on Solid State Devices by Addison-Wesley Publishing, Reading, MA 1988.

P.G. Neudeck, G.M. Beheim, and C.S. Salupo, entitled "*600° C Logic Gates Using Silicon Carbide JFETs*" and published in Government Microcircuit Applications Conference Technical Digest, Anahiem, CA, 2000, pp. 421-424.

G.W. Neudeck entitled "*The PN Junction Diode*" given on pp. 75-82 thereof and published by Addison-Wesley Publishing 1989, Reading, MA.

D.J. Spry et al "*Fabrication and Testing of 6H-SiC JFET for Prolonged 500° C Operation in Air Ambient*" presented at the 2007 International Conference on Silicon Carbide and Related Materials, Oct. 15, 2007, and published in Materials Science Forum vols. 600-603, pp. 1079-1082, Sep. 2008.

(Continued)

*Primary Examiner* — Kevin M Picardat
*Assistant Examiner* — Neil Prasad
(74) *Attorney, Agent, or Firm* — Robert H. Earp, III

(57) ABSTRACT

A method is disclosed that provides a self-aligned nitrogen-implant particularly suited for a Junction Field Effect Transistor (JFET) semiconductor device preferably comprised of a silicon carbide (SiC). This self-aligned nitrogen-implant allows for the realization of durable and stable electrical functionality of high temperature transistors such as JFETs. The method implements the self-aligned nitrogen-implant having predetermined dimensions, at a particular step in the fabrication process, so that the SiC junction field effect transistors are capable of being electrically operating continuously at 500° C. for over 10,000 hours in an air ambient with less than a 10% change in operational transistor parameters.

21 Claims, 16 Drawing Sheets

OTHER PUBLICATIONS

P.G. Neudeck et al *Long Term Characterization of 6H-SiC Transistor Integrated Circuit Technology Operation at 500° C*" presented at the Materials Research Society 2008 Spring Meeting, Mar. 25-27, 2008, San Francisco, CA, and published in Materials Research Society Symposium Proceedings, vol. 1069, pp. 209-214, Apr. 2008.

D.J. Spry et al *Electrical Operation of 6H-SiC MESFET at 500° C for 500 Hours in Air Ambient*" published in Proceedings 2004 IMAPS International Conference Exhibition on High Temperature Electronics (HiTEC 2004), May 2004.

R.S. Okojie, D. Lukco, Y.L. Chen, and D.J. Spry, "Reliability Assessment of Ti/TaS1$_2$/Pt Ohmic Contacts on SiC after 1000 h at 600° C" published in the Journal of Applied Physics, vol. 91, No. 10, pp. 6553-9559, 2002.

Liang-Yu-Chen and Jih-Fen Lei "Packing of Harsh Environment MEMS Devices" contained in the MEMS Handbook (Second Editoion 2006) published by CRC Press, Boca Raton, Florida.

Philip G. Neudeck et al "Extreme Temperature 6H-SiC JFET Integrated Circuit Technology" published on-line Jun. 29, 2009 and will appear as a featured article of the Journal entitled Physica Status Solidi A.

\* cited by examiner

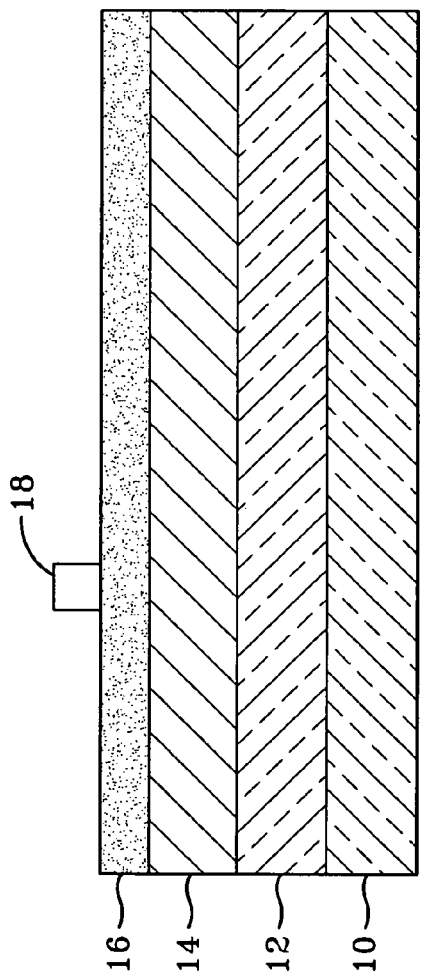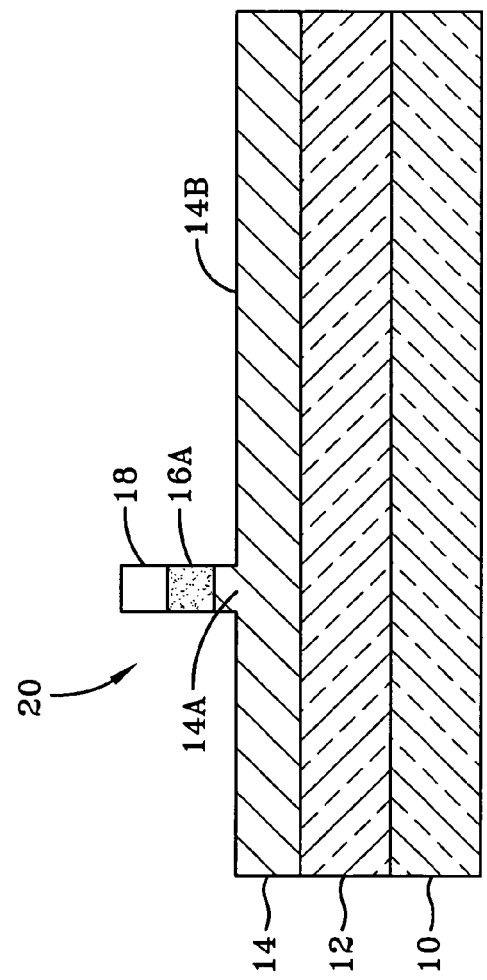

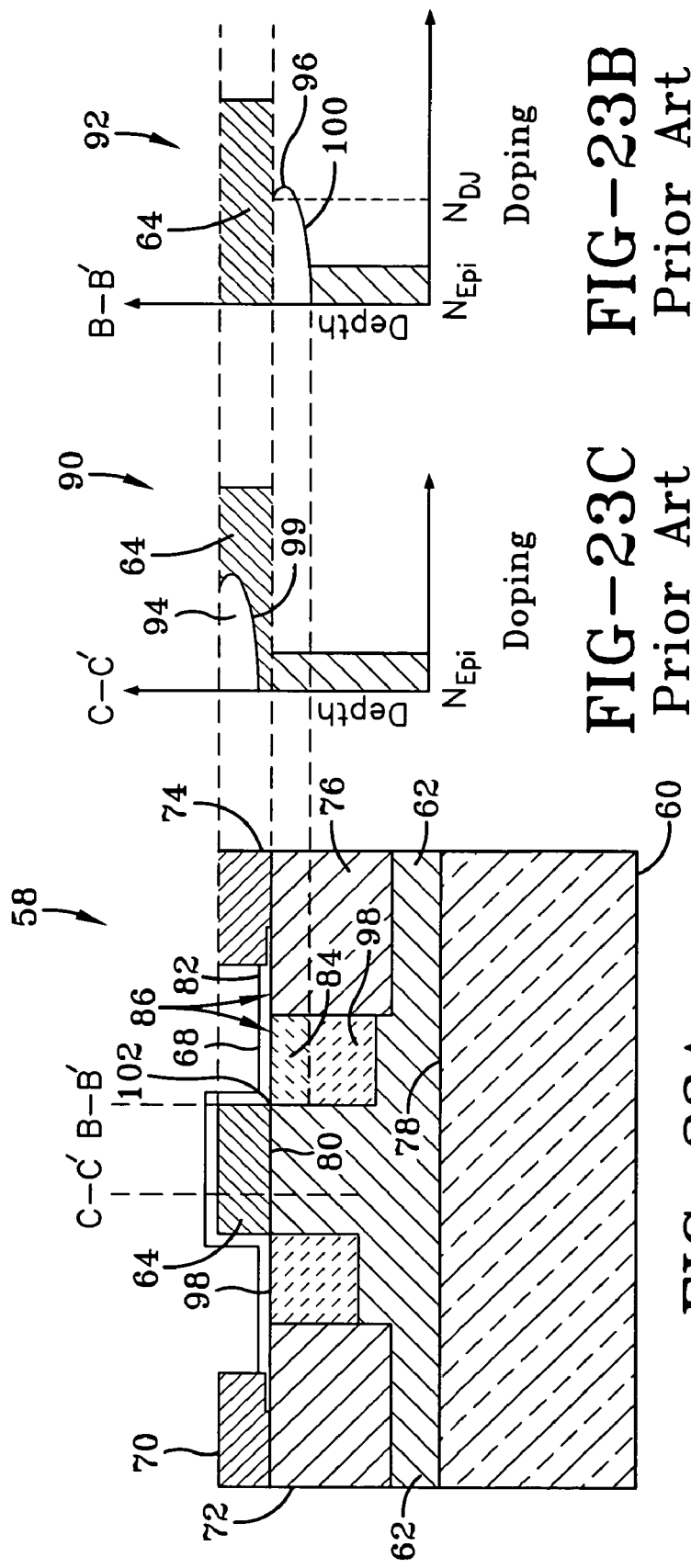

METHOD FOR PROVIDING SEMICONDUCTORS HAVING SELF-ALIGNED ION IMPLANT

ORIGIN OF THE INVENTION

The invention described herein was made by an employee of the United States Government and may be used by or for the Government for governmental purposes without payment of any royalties thereon or therefor.

FIELD OF THE INVENTION

The invention relates to a method for fabricating semiconductors. More particularly, the invention is a method that provides a self-aligned nitrogen-implant particularly suited for Junction Field Effect Transistors (JFETs) comprised of silicon carbide. The method provides silicon carbide JFETs that are capable of being electrically operated continuously at about 500° C. for over 10,000 hours in an air ambient allowing less than a 10% change in operational transistor parameters. The method of the present invention produces semiconductor devices that operate above 300° C. and are beneficially used in aerospace, automotive, industrial and energy producing systems. The method of the present invention provides semiconductor devices for aerospace combustion engine applications with operating temperatures approaching 600° C.

BACKGROUND OF THE INVENTION

As the reliable operating temperature envelope of integrated silicon electronics has been expanded from 125° C. to temperatures above 200° C., these electronics have found beneficial use in aerospace, automotive, industrial and energy production systems. Further extension of the reliable operational envelope of semiconductor electronics above 300° C. is also expected to offer additional benefits to these industries, particularly in aerospace combustion engine applications where operating temperatures can approach or exceed 600° C. The emergence of wide band gap semiconductors including silicon carbide (SiC), diamond, and gallium nitride (GaN), has enabled short-term electrical device demonstrations at ambient temperatures from 500° C. to 650° C. However, these devices have previously not demonstrated sufficient long-term durability when electronically operated at these high temperatures to be considered viable for most envisioned applications. It is desired to provide a method for fabricating semiconductor devices that may be successfully operated continuously at temperatures of at least 500° C. for over at least 10,000 hours in air ambient with no more than a 10% change in operational transistor electrical parameters.

OBJECTS OF THE INVENTION

It is a primary object of the present invention to provide a method for fabricating semiconductor devices that may be successfully operated at temperatures of at least 500° C. for over 10,000 hours air ambient allowing for no more than a 10% change in operational transistor parameters.

It is another object of the present invention to provide for Junction Field Effect Transistors (JFETs) semiconductor devices comprised of 6H—SiC material or 4H—SiC material and that may successfully operate at temperatures of at least 500° C. for at least 10,000 hours.

It is another object of the present invention to provide a method for forming JFET devices used for integrated circuit applications that are successfully operated at temperatures of at least 500° C. for over at least 10,000 hours allowing for no more than 10% change in operational circuit electrical parameters.

SUMMARY OF THE INVENTION

The present invention provides a process and the benefits therefrom for forming a foundation element for semiconductor devices. The semiconductor devices may be successfully operated at temperatures in excess of 500° C. for prolonged durations exceeding thousands of hours. The method comprises the steps of; a) providing a wafer of a wide band gap serving as a substrate; b) growing a first epitaxial layer of p-type wide band gap material on the substrate with p doping density less than about $2\times10^{17}$, $cm^{-3}$; c) growing a first epitaxial layer of n-type wide band gap material with the n-type epilayer having a predetermined doping density, which exceeds twice the p doping density of the first epitaxial layer of p-type wide band material and with a preselected n-type epilayer thickness, wherein the n-type epilayer doping density and said n-type epilayer thickness being selected to provide a desired junction field effect transistor threshold voltage.

The method further comprises the steps of; d) growing a first epitaxial layer of a highly conductive p+ type wide band gap material of p+ thickness which is less than the preselected n-type epilayer thickness, the first epitaxial layer of p+ type wide band gap material having a p+ doping density selected to be greater than about twice the n-type epilayer doping density, the growing of the first epitaxial p+ type wide band gap material being on top of the growing of the first epitaxial layer of n-type wide band gap material; e) depositing and patterning a first masking layer of first masking thickness on top of the first epitaxial layer of highly conductive p+ type material, so as to form a first element of a p+ gate region; f) etching so as to (1) remove all of the first epitaxial layer of the highly conductive p+ type wide band gap material, except for a portion laying under the first masking layer so as to form a second element of the p+ gate region with the second element of the p+ gate region having a top surface, the etching also (2) removing a portion of the top surface of the epitaxial layer of the first epitaxial layer of n-type wide band gap material, so as to form an exposed n-type wide band gap material surface, the etching also leaving a portion laying under the second element of said p+ gate region that forms a third element of the p+ gate region, wherein the first, second and third elements form the p+ gate region.

The method further still comprises the steps of: g) performing a self-aligned implant of n-type dopant into self-aligned implant region that is provided by a union of both the exposed n-type wide band gap material surface and the first element of the p+ gate region, the self-aligned implant having a region abutting said p+ gate region, the self-aligned implant of n-type dopant further having a (1) a first peak doping (2) a first peak depth, and (3) a first straggle into the p+ gate region, the self-aligned implant further having (4) a second peak doping (5) a second peak depth, and (6) a second straggle into the n-type epitaxial layer of n-type wide band gap material beneath the exposed n-type wide band gap material surface, wherein the sum of the first peak depth plus the first straggle is less than the sum of said p+ thicknesses of the highly conductive p+ type wide band material and the first masking thickness; the first peak doping being less than 50% of the p+ doping density of the highly conductive first epitaxial layer of highly conductive p+ type wide band gap material, and said second peak doping being greater than twice the n-type epilayer doping density.

The method further comprises the steps of: h) depositing and patterning a second masking layer on selected portions of (1) the p+ gate region and (2) the implant region abutting the p+ gate region and extending outward therefrom; i) etching so as to form a n-channel mesa by progressively removing all of the p-type, n-type and p+ type wide band gap material to a depth that removes all of the first epitaxial layer n-type wide band gap material except in predetermined regions beneath one or both of the first or second masking layer.

BRIEF DESCRIPTION OF THE DRAWINGS

FIG. 1 is composed of FIGS. 1A and 1B, wherein FIG. 1A is a first embodiment in which a substrate is first provided and then three (3) epitaxial layers are grown all with precise control of doping and also providing precise control of thicknesses thereof; and wherein

FIG. 2 illustrates the preparation of a first element of a p+ gate region by the depositing and patterning of a first masking layer.

FIG. 3 illustrates the preparation of the second and third elements of the p+ gate region by the use of a etch, preferably a reactive ion etch, into two of the three epitaxial layers of FIG. 1A.

FIG. 4 is composed of FIGS. 4A and 4B, wherein FIG. 4 illustrates the self-aligned ion implant of nitrogen n-type dopant that is of particular importance to the present invention.

FIG. 5 is composed of FIGS. 5A and 5B, wherein FIG. 5 illustrates the formation of a second patterned mask layer deposited on the top of the first element of the p+ gate region and extending outward therefrom to define the extent of a n-channel region to be defined by subsequent etching.

FIG. 6 is composed of FIGS. 6A and 6B, wherein FIG. 6 illustrates the formation of the n-channel mesa involving the etching, preferably reactive ion etch, of the self-aligned nitrogen-implant and the epitaxial layers of the device not protected by first or second masking layers illustrated in FIG. 5.

FIG. 7 is composed of FIGS. 7A and 7B, wherein FIG. 7 illustrates the device of FIG. 6 as having been stripped of its first and second masking layers.

FIG. 23 is composed of FIGS. 23A and 23B and 23C and cumulatively represent a simplified schematic cross-section of another JFET prior art device not having the benefits of the present invention.

DETAILED DESCRIPTION OF THE PREFERRED EMBODIMENTS

In general, the present invention relates to a method for fabricating semiconductive devices. More particularly, the present invention relates to fabricating silicon carbide (SiC) Junction Field Effect Transistors (JFETs) that have durable and stable electrical functionality at high temperatures. The JFETs of the present invention may be continuously operated at a temperature of at least 500° C. for over 10,000 hours and in an air ambient allowing for less than a 10% change in operational transistor parameters. Specifically, the method of the present invention provides a self-aligned nitrogen-implant, which is of particular importance to the present invention and that allows for the durable and stable electrical functionality of JFETs. The present invention may be described with reference to FIGS. 1A-21, all of which are cross-sectional views partially showing the central regions thereof and some (FIGS. 4-8) of which also have top views thereof.

Figure 1A:
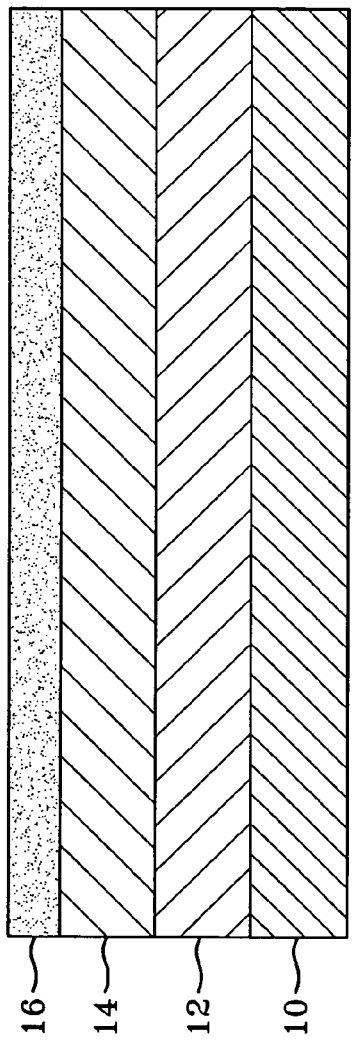

FIG. 1A illustrates a wafer 10 having thereon epitaxial layers 12, 14, 16, which are grown using conventional techniques. However, the epitaxial layers 12, 14 and 16 are grown in a precise manner, so as to accurately control the doping and thickness which are of critical importance to circuit operation. The growing of epitaxial layers 12, 14 and 16 (as well as 12' of FIG. 1B, to be discussed) may be accomplished using commercially available equipment. The wafer 10 serves as a substrate and has a thickness of about 400 micrometers. The substrate 10 is comprised of a SiC material (known in the art) and is a single-crystal type. The device to be described can be implemented in any commercially available polytypes of SiC material that are commercially available (know in the art), especially including 4H—SiC, 6H—SiC, and 3C—SiC polytypes. As used herein the terms "doping density," "doping concentration," and "doping level" are used in interchangeable manner. Furthermore, the conductivity character of the substrate 10 can be n-type, p-type, or "insulating" (known in the art). Still further, the substrate 10, as well as layers 12, 14, and 16 is of a wide band gap material including silicon carbide (SiC) diamond, and gallium nitrides previously discussed in the "Background" section.

The layer 12 is of a p-type material and is also grown by using a p-type dopant concentration of less than about $2 \times 10^{17} cm^{-3}$. Preferably, the p-type dopant concentration is less than $1 \times 10^{16} cm^{-3}$ with a thickness exceeding 4 micrometers, but less than 30 micro-meters. More particularly, the range of the p-type dopant concentration is in the range from $1 \times 10^{12} cm^{-3}$ to $1 \times 10^{17} cm^{-3}$. The growth of well-controlled SiC epitaxial layers, including controlled introduction of p-type impurities, such as aluminum or boron to the desired concentrations in the crystal, is known in the art.

The layer 14 is an epitaxial layer of n-type material and is preferably grown using a doping level of about $1-2 \times 10^{17} cm^{-3}$ and is also grown to have a thickness in the range of about 0.2 to 0.4 micro-meters. This layer may subsequently be referred to herein as the "channel layer."

The first epitaxial layer 14 of n-type is of a wide band gap material and is grown on top of the first epitaxial layer 12 of p-type wide band gap material, with n-type epilayer doping density exceeding twice the p doping density of the first p-type epitaxial layer 12. The first n-type epitaxial layer 14 has a particular selected n-type epilayer thickness, wherein both the n-type epilayer doping density and the n-type epilayer thickness are both selected to provide a desired junction field effect transistor threshold voltage as is known in the art. It is well known in the art that the threshold voltage $V_T$ of an n-channel JFET is the amount of voltage that needs to be applied to the p+ gate terminal of a JFET for the JFET channel to transition from conducting "turned-on" state that carries current between the source and drain electrodes to blocking "turned-off" state that prevents current flow between the source and drain electrodes. The threshold voltage of a JFET is well known to be linked to the doping levels of epilayers 12, 14, and 16, as well as the thickness of layer 14. More particularly, the threshold voltage $V_T$ of an n-channel JFET fabricated by these layers is known to be approximated to first order by equation (1) given below:

$$V_T = \frac{kT}{q} \ln\left(\frac{N_A N_D}{n_i^2}\right) - \frac{q N_D D^2}{2\varepsilon_s} \quad (1)$$

where q is the electron charge constant ($1.6 \times 10^{-19}$ Columbs), k is the Boltzman constant ($1.38 \times 10^{-23}$ Joules/Kelvin), T is the temperature (in Kelvin), $N_A$ is the doping density of the p+ gate epilayer (in number of dopant atoms/$cm^{-3}$) 16, $N_D$ is the donor doping density of the n-channel epilayer (also in $cm^{-3}$) 14, $\varepsilon_s$ is the semiconductor dielectric constant (about $8.5 \times 10^{-13}$ Farads/cm for SiC) and D is the thickness of the n-channel epilayer 14 (in cm). Note that the above approximation assumes that p-type doping density of p-epilayer 12 is much smaller than the doping density layer of n-channel epilayer 14 so that its contribution to $V_T$ is insignificant (and thus omitted from the $V_T$ approximation equation (1)).

The epitaxial layer 16 is of a p+ type and is grown using a doping level in the range of $10^{18} cm^{-3}$ to about $10^{22} cm^{-3}$. Preferably the epitaxial layer 16 is grown to have a thickness in the range of about 0.1 to about 0.5 micro-meters. The first epitaxial layer of p+ 16 is of a highly conductive p+ type wide band gap material and has a p+ thickness less than the selected n-epilayer 14 thickness, but within 50% of half the thickness of n-epilayer 14. Further, the first p+ epitaxial layer 16 preferably has a p+ doping density which is preferably selected to be greater than about twice the n-type epilayer 14 doping density. The first p+ epitaxial layer 16 is grown on top of the first epitaxial layer 14 of n-type wide band gap material. The p+ layer 16 may subsequently herein be referred to as the "p+ gate layer." As will be described hereinafter, the relatively high doping concentration present in this layer 16 is of importance to subsequent operation of the JFET. Another embodiment of the present invention may be described with reference to FIG. 1B.

Figure 1B:
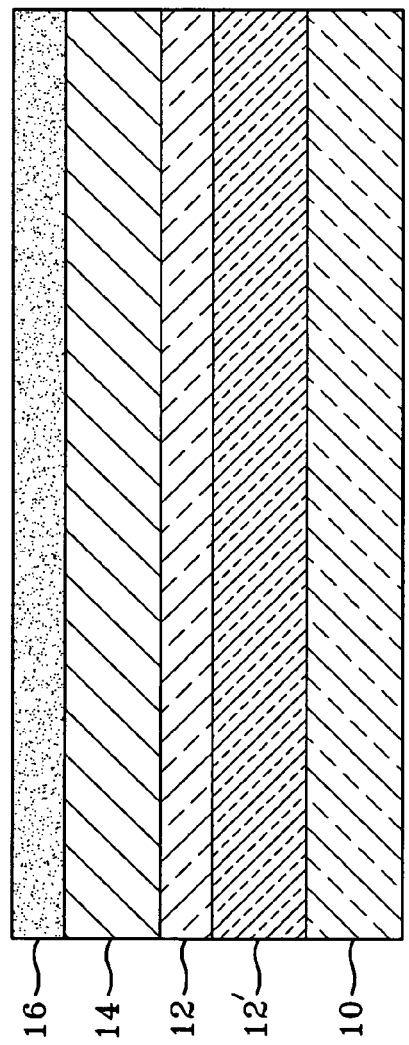
FIG. 1B is an alternative embodiment having an additional layer acting as a buffer layer for selected circuit applications.

FIG. 1B illustrates all the elements 10, 12, 14 and 16 of FIG. 1A with the addition thereof an epitaxial layer 12'. This p+ buffer epitaxial layer 12' may be a wide band gap material and is of a p+ type material having a thickness of about 0.5 to 1 micrometer. The p+ buffer epitaxial layer 12' is grown by utilizing a doping level of about $10^{18} cm^{-3}$ to $10^9 cm^{-3}$. As seen in FIG. 1B, the p+ buffer epitaxial layer 12' is interposed between the substrate 10 and p-type epitaxial layer 12. The layer 12' serves as a buffer layer for selected operations.

As is known in the art, each junction of p-type semiconductor with n-type semiconductor forms an electrical pn junction whose electronic properties vitally enable successful semiconductor electronic devices including transistors. Different approaches to carry out the transitions from p-type to n-type material are known in the art, and include linear and non-linear grading of dopant concentration and insertion of lightly-doped thin regions between p and n layers. It should be readily understood to those skilled in the art that these known prior-art modifications to any of the pn junctions illustrated in FIG. 1A and FIG. 1B could be implemented. These modifications would produce slightly more complicated epilayer structures than those depicted in FIGS. 1A and 1B, which could also be used in the practice of the present invention. The embodiments of both FIGS. 1A and 1B may be further described with reference to FIG. 2.

FIG. 2 schematically illustrates a first masking layer 18 which preferably has a thickness of about 0.1 to 0.5 micrometers and is deposited and patterned on top of the p+ gate epitaxial layer 16, of high conductive p+ type material. The first masking layer 18 is created by the use of conventional deposition and photolithographic patterning techniques known in the art. More particularly, a patterned masking, such as nickel or aluminum, is deposited and patterned with standard photolithographic liftoff (preferred) or etching to form the first masking layer 18. The first layer 18 is further arranged as shown in FIG. 3.

FIG. 3 illustrates the first masking layer 18 as being a first element of a p+ gate region 20 further comprising second and third elements 16A and 14A. The element 16A is created by selective etching (known in the art) of epitaxial layer 16 thereby leaving element 16A which is directly located under first masking layer 18. The element 14A is formed by continuing the selective etching slightly beyond the pn junction interface of layers 16A and 14A. The selective etching is in regions not beneath first masking layer 18 and this forms exposed n-type wide band gap material surface 14B, which is utilized by self-aligned nitrogen implant 22, to be further described hereinafter with reference to FIG. 4. The elements 16A and 14A respectively, form the second and third segments of the p+ gate region 20. The p+ gate region 20 is further arranged and may be further described with reference to FIG. 4, which is composed of FIGS. 4A and 4B, wherein FIG. 4A is a cross-section view taken along dashed line B-B' of FIG. 4B and FIG. 4B is a top view.

Figure 4A:
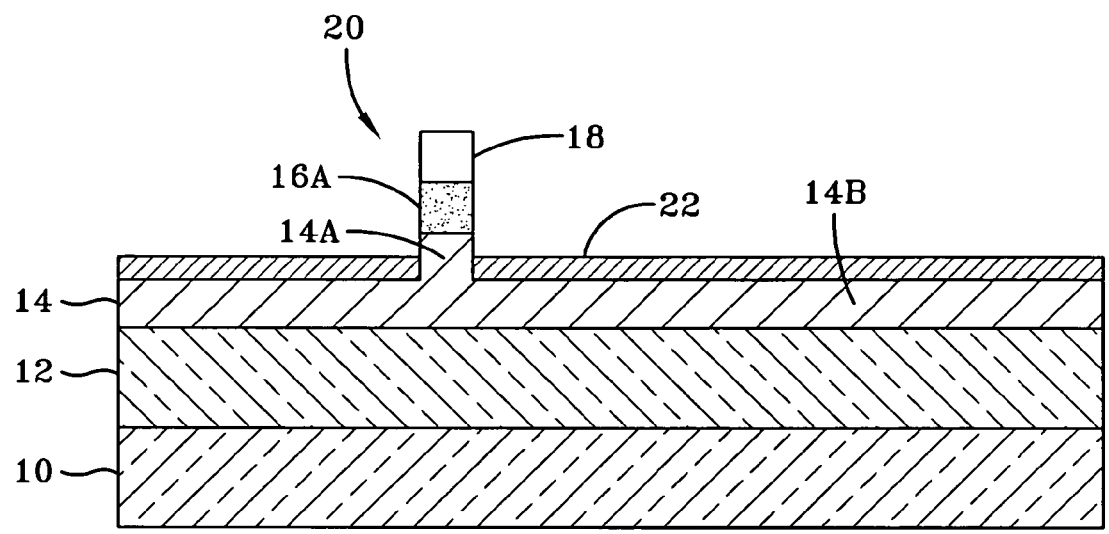
FIG. 4A is a cross-section view and FIG. 4B is a top view. More particularly.
Figure 4B:
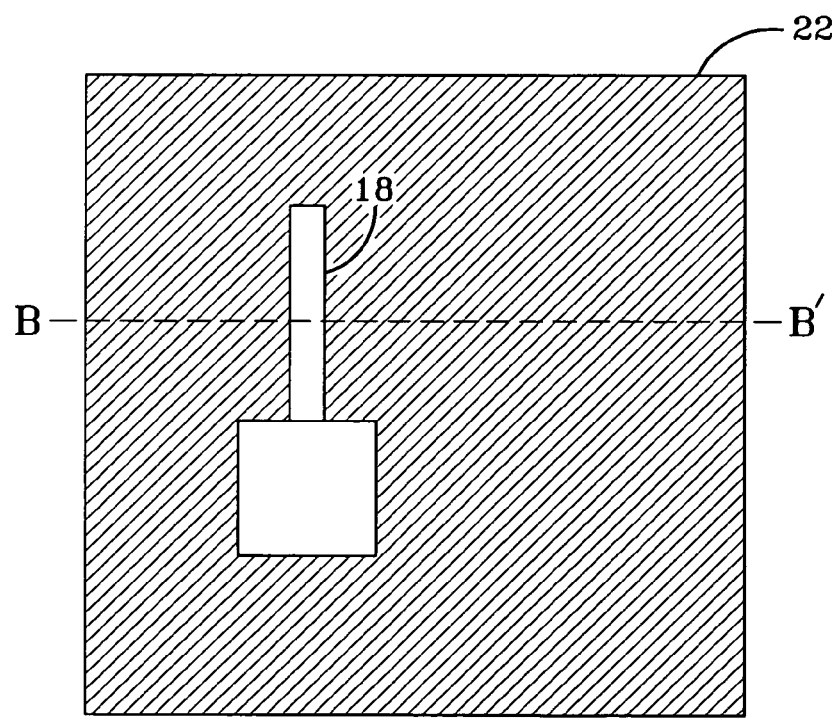

FIG. 4 illustrates the formation of a self-aligned nitrogen-implant 22, which is of particular importance to the present invention. In contrast to other ion implantation process steps (to be described later) this self-aligned ion implant step 22 beneficially does not require any additional masking or photolithography beyond what was already carried out to define first masking layer 18 and the first 16A and second 14A elements of p+ gate region 20 previously described. In other words, the wafer, such as substrate 10, with devices as illustrated in FIG. 3 can be placed straight into an ion implanter (equipment known in the art) and suitably implanted to reach the schematic cross-section of FIG. 4A. This direct placement into an ion implanter provides a more streamlined and cost-effective implantation step 22 than possible for implantation process step requiring its own (separate) patterned masking layer (such as source and drain ion implantation step to be described later with respect to FIGS. 8-10).

A further important benefit of performing the self-aligned ion implantation at this stage of the process (i.e., with device cross-section as shown in FIG. 3) compared to prior art processes, is that the dopant ions, associated with the self-aligned nitrogen-implant 22, can be implanted to greater depth and with greater dose (i.e., concentration) into the exposed n-channel regions 14B that are not beneath the p+ gate layer 16A. These important benefits to device performance are to be further described with respect to FIGS. 21-23.

These dopant ion depth and dose considerations are enabled by the process sequence that provides for the presence of both the first masking layer 18 and the first element 16A of the p+ gate region that cooperatively act as a thicker self-aligned implant mask than prior art processes. Such a thicker self-aligned implant mask better prevents implanting ions, associated with the self-aligned nitrogen-implant 22, from undesirably reaching the electrically critical n-channel epitaxial layer 14A that resides directly underneath the p+ element 16A. The arrangement in turn permits higher energy and higher dose self-aligned ion implantation to be achieved in n-channel regions 14B without compromising (i.e., undesirably changing) the electrical properties of n-channel regions 14A beneath the p+ gate layer 16A. Additional benefits of performing the self-aligned ion implantation at this stage of the process, which lead to overall process simplification, will become apparent later herein with respect to subsequent descriptions related to FIG. 6 and FIG. 10.

The self-aligned nitrogen-implant 22 is formed by ion implanting an n-type dopant, preferably nitrogen in the case where the wide band gap material is a polytype of SiC, into the top surface of the device, as shown in simplified schematic in FIG. 4. The self-aligned implant 22 is of a n-type dopant placed into a self-aligned implant region provided by (as seen in FIG. 4A) a union of both the uncovered wide band gap material 14B and the first element 18 or layer 16A. The self-aligned implant 22 has a region abutting the p+ gate region 20. The implantation of the self-aligned nitrogen-implant 22 is preferably carried out at room temperature to avoid interfacial reactions between the first etch mask 18 (that will be subsequently stripped) and top wide band gap material surface of the p+ gate element 16A. However, the self-aligned implant of nitrogen dopant may be carried out at a temperature in the range of minus 55° C. (−55° C.) to plus 200° C. (+200° C.).

In one embodiment, a nitrogen implantation at 70 keV ion energy and $3.6 \times 10^{12} cm^{-2}$ dose (known in the art) may be employed. The self-alignment structure of the implant 22 has some general similarity to self-aligned implants known in the art of silicon MOSFET manufacture, such as the nitrogen implant described in U.S. Pat. No. 5,953,632. However, these prior art processes are not applicable to the formation of wide band gap JFET process described herein and these prior art processes do not enable prolonged and stable operation of transistors at 500° C. ambient temperature.

The implantation of dopant ions is known in the art of semiconductor device manufacture. A general overview of the ion implantation process can be found in textbooks of the art including Chapter 5 of Introduction to Micoelectronic Fabrication by Richard C. Jaeger, (Addison-Wesley Publishing, Reading, Mass., 1988). As described in the Jaeger chapter, it is important to note that implantation at a single energy (i.e., 70 keV) results in a "hill-like" (Gaussian) implanted dopant versus depth into the solid (semiconductor), to be further described with respect to FIGS. 21-23. This "hill-like" configuration is not indicated by the simplified depiction of the implanted layer 22 in the drawings of FIGS. 4-20. It is also known in the art that post-implantation annealing of the semiconductor at high temperature is needed for ion-implanted dopants to successfully "activate" to their desired electrical properties.

As will be described with reference to FIGS. 21-23, the self-aligned implant 22 of n-type dopant has a (1) a first peak doping (2) a first peak depth, and (3) a first straggle depth into the first etch mask 18 and p+ element 16A forming part of p+ gate region 20. The self-aligned implant 22 further has (4) a second peak doping (5) a second peak depth, and (6) a second straggle depth into the n-type epitaxial layer of n-type wide band gap material located beneath the exposed n-type wide band gap material surface 14B, wherein the sum of the first peak depth plus the first straggle is less than the sum of the p+ thicknesses and the first masking thickness; the first peak doping being less than 50% of the p+ doping density of the highly conductive first epitaxial layer of highly conductive p+ type wide band gap material. Further, the second peak doping is greater than twice the n-type epilayer 14 doping density. The continued formation of the device of the present invention may be further described with reference to FIG. 5, which is comprised of schematic cross-section FIG. 5A taken across dashed line B-B' of the top view of the device shown in FIG. 5B.

Figure 5A:
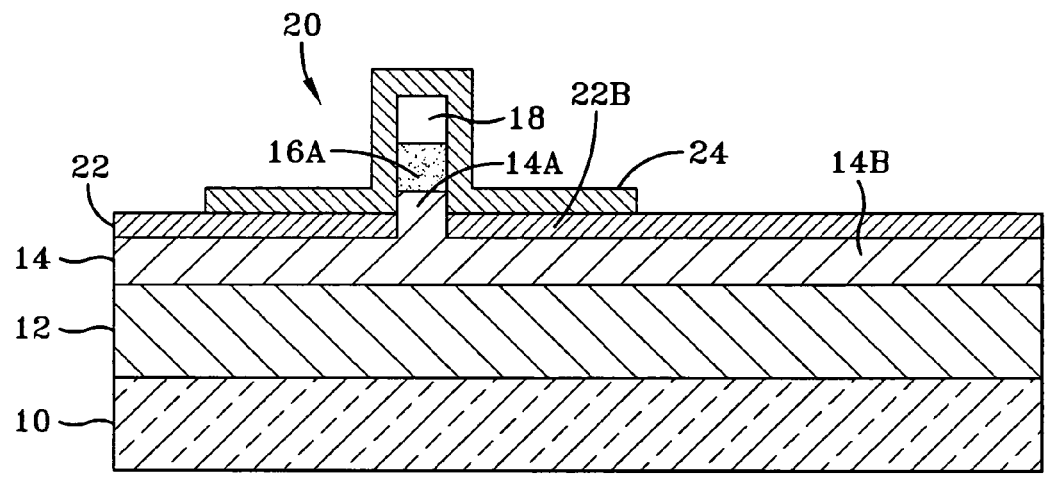
FIG. 5A is a cross-sectional view and FIG. 5B is a top view. More particularly.
Figure 5B:
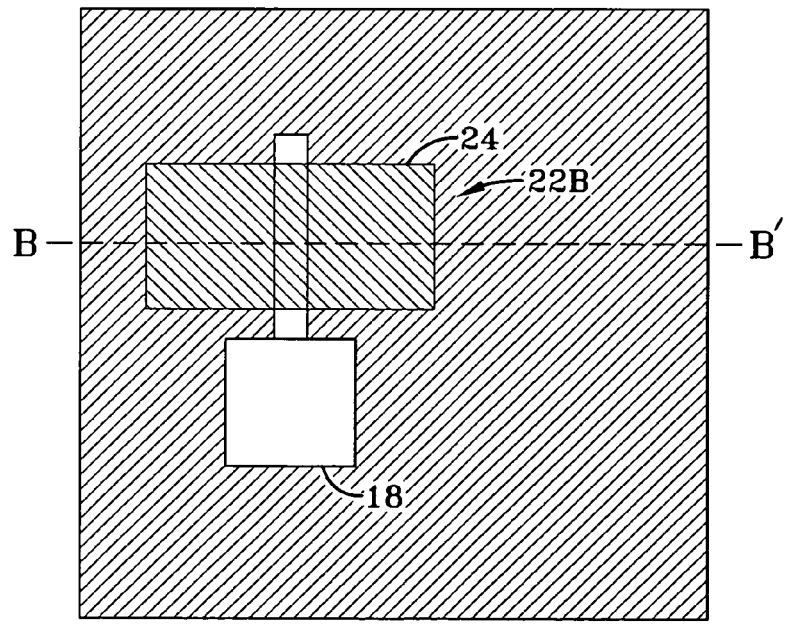

FIG. 5A shows a schematic cross-section illustrating the element 16A of the p+ gate region 20, as well as selected portions 22B of the nitrogen implanted region 22. The selected region 22B abuts the p+ gate region 20 and extends outward therefrom. The selected region 22B has a second masking layer 24 deposited thereon. FIG. 5B shows the top view of this same device illustrating that some lateral regions of first masking layer 18 are covered by second masking layer 24, whereas other lateral regions of first masking layer 18 are not covered by second masking layer 24. The portion of the implant 22 covered by the masking layer 24 is indicated in phantom by symbol 22B.

The depositing and patterning of the second masking layer 24 is preferably accomplished using the same material and processing that formed first masking layer 18. In particular, a (known in the art) liftoff photolithographic patterning process is preferred as this permits complete preservation of uncovered first masking layer 18 during patterning of second masking layer 24. The overall etch mask defined by the union of first 18 and second 24 masking layers defines the lateral extent of the electrically active area of the JFET, as will be described with reference to FIG. 6.

Figure 6A:
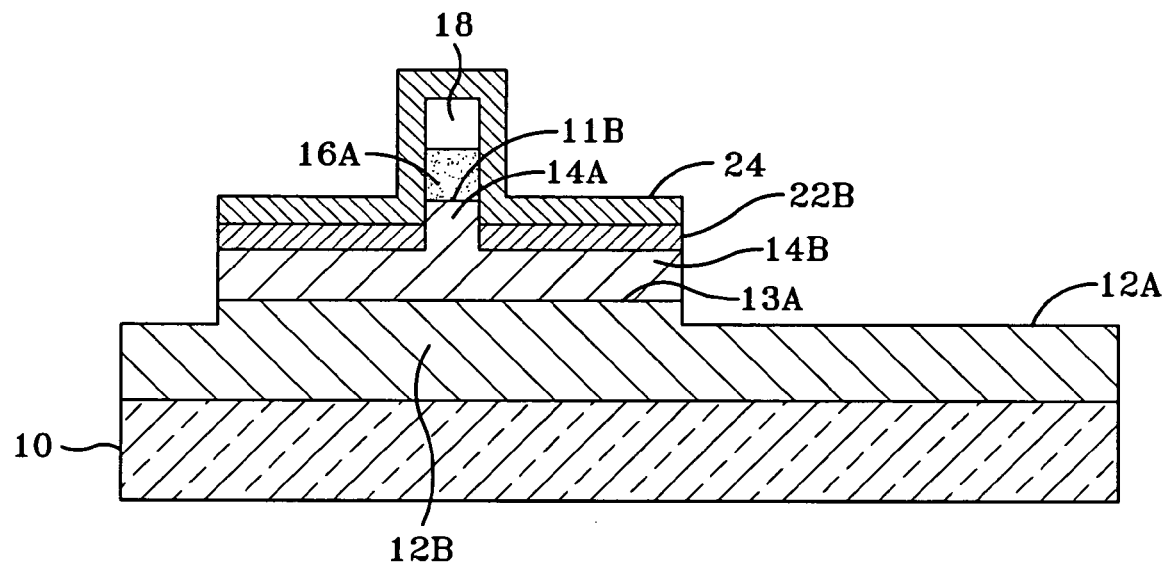
FIGS. 6A and 6B are respectively cross-sectional and top views. More particularly.
Figure 6B:
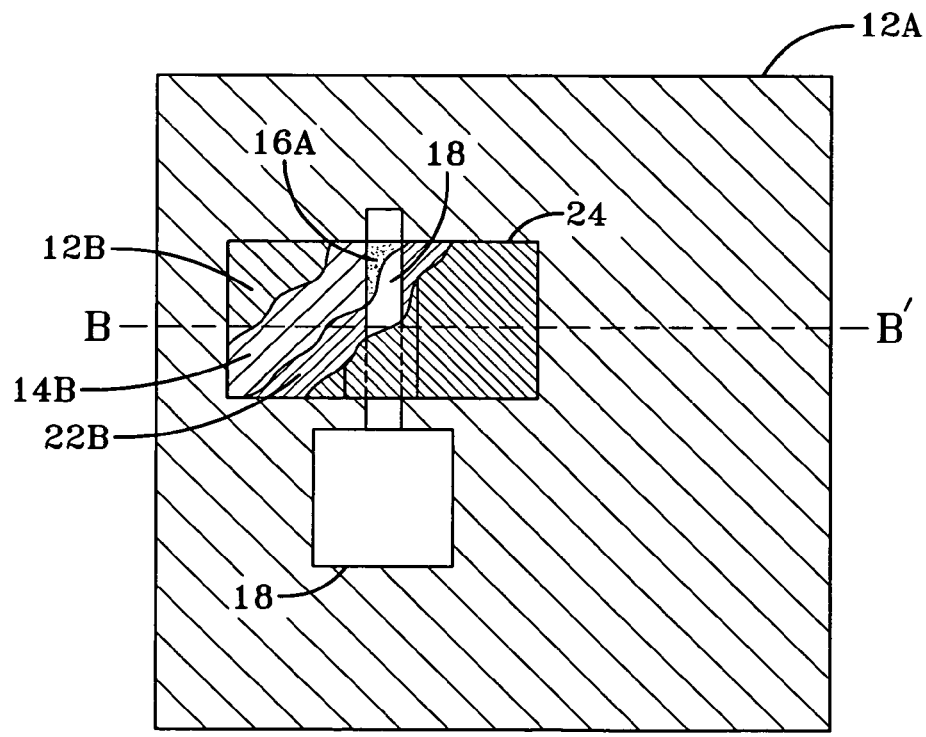

FIG. 6 is comprised of schematic cross-section FIG. 6A and top view FIG. 6B, wherein dashed line B-B' in FIG. 6B illustrates the cut-line for the cross-sectional illustration in FIG. 6A. In particular, FIG. 6A shows the resulting cross-sectional structure of the device of FIG. 5 after etching is performed, so as to remove all the n-channel epitaxial layer 14 including region containing self-aligned nitrogen implant 22, except for beneath either the first 18 or second 24 masking layer. Beneath the second masking layer 24 implanted regions 22B remain that are abutting the p+ gate region 20 and extending outward therefrom. The etching that removes the n-channel epitaxial layer 14 forms layer 14B shown in FIG. 6A.

To ensure proper electrical performance while accounting for the possibility of some process variation in etching depth across the wafer, such as substrate 10, this etch of FIG. 6 also slightly penetrates the underlying p-epilayer 12 shown now in FIG. 6 by symbol 12A. This etching step forms the JFET n-channel 14B, with a channel-to-substrate pn junction 13A at the bottom, that electrically isolates adjacent JFET transistors fabricated on the same substrate chip from each other as desired during the manufacture of transistor integrated circuit chips. The electrical rectifying properties of the channel-to-substrate pn junction 13A and gate-to-channel pn junction 11B (also shown in FIG. 6A) are both known in the art as being important to obtaining good JFET electrical functionality. This etching step of FIG. 6A produces a surface 12A and a segment 12B of p-type material, wherein segment 12B is located directly under the n-channel epitaxial layer 14B. The etching of wide band gap material, such as layers 12 and 14, removes self-aligned implant 22 and the epitaxial layers (part of 12 and all of 14) from regions not protected by either first 18 or second 24 etch masking layers. The etching is preferably accomplished by utilizing a reactive ion etch known in the art.

Figure 7A:
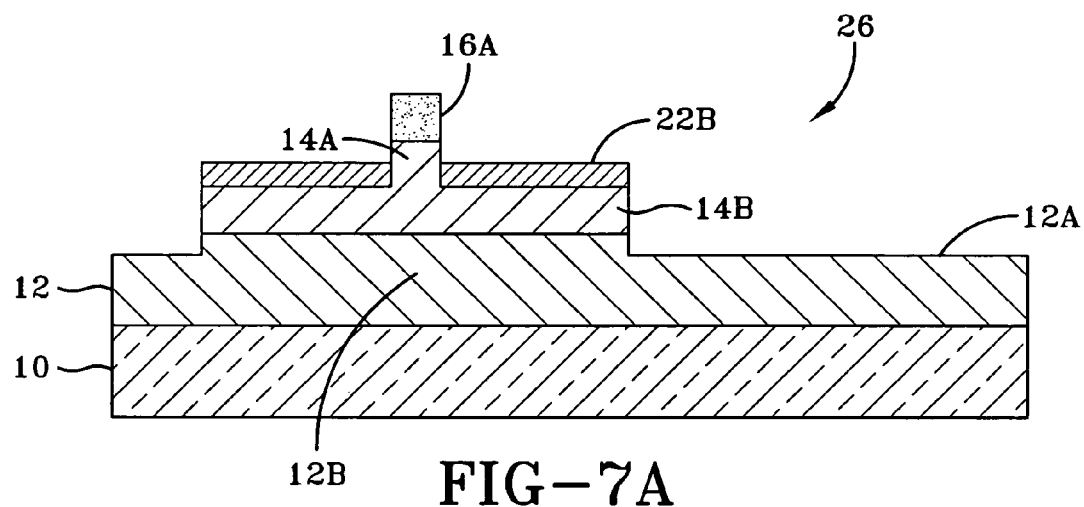
FIG. 7A is a cross-sectional view and FIG. 7B is a top view. More particularly.
Figure 7B:
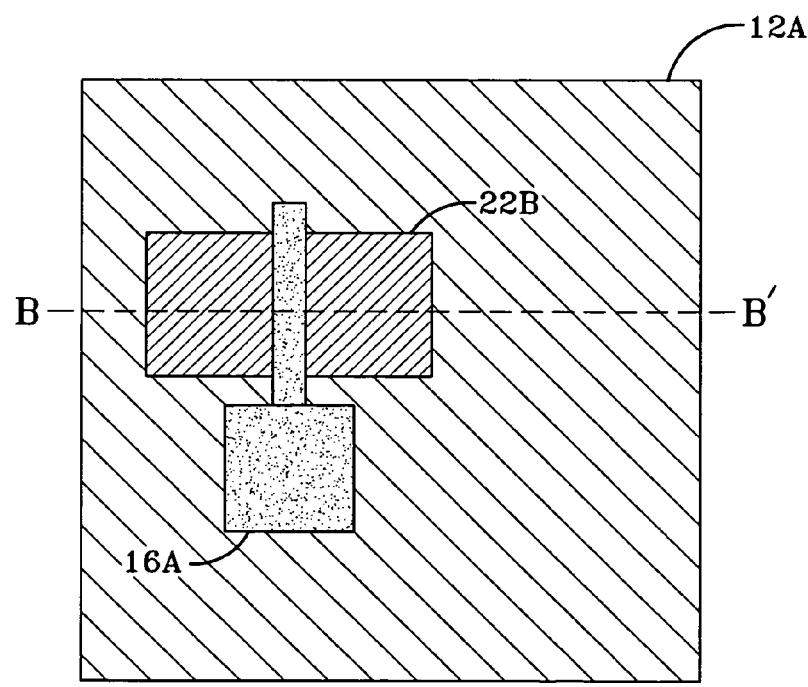

FIG. 7 is composed of schematic cross-section FIG. 7A and top view FIG. 7B, wherein dashed line B-B' in FIG. 7B illustrated in the cut-line for cross-sectional illustration in FIG. 7A. FIG. 7A shows the device of FIG. 6 having been stripped of the first and second masking layers 18 and 24 respectively.

The overall structure of FIG. 7 is identified by reference number 26. The element 26 serves as a foundation element for the further fabrication of JFET semiconductor devices that may be operated at temperatures of at least 500° C. for a duration of 10,000 hours, while only suffering no more than 10% in operational transistor parameters.

The foundation element 26 embodying the improved self-aligned nitrogen implant 22B is of particular importance to the present invention and advantageously differs from prior art methods. One such prior art method is described in a technical article of "P. G. Neudeck, G. M. Beheim, and C. S. Salupo, entitled "600° C. Logic Gates Using Silicon Carbide JFET's," and published in Government Microcircuit Application Conference Technical Digest, Anahiem, Calif., 2000, pp. 421-424.

Unlike prior art methods, the self-aligned nitrogen-implantation step shown in FIG. 4 is carried out immediately following gate region 20 etching of FIG. 3 and prior to mesa pattern definition etching of FIG. 6. Prior art disclosed in the previously mentioned technical article of P. G. Neudeck et al carries out its self-aligned implant, after n-channel mesa pattern definition and after source/drain nitrogen-implantation to be further described herein. This immediate etching of the present invention provides the benefits mentioned above and given in the descriptions of FIGS. 3, 4, 5, 6, 7, and 21 (to be described).

Still further, the self-aligned nitrogen-implantation step, shown in FIG. 4, is carried out at room temperature, unlike some prior art SiC processes that are carried out at high temperatures. Equipment necessary to perform the steps of FIG. 4, operating at room temperature for nitrogen-implantation, is readily available in the semiconductor industry, whereas prior art processes carried out at a 600° C. high temperature for nitrogen-implantation requires specialized equipment with less availability and higher cost.

Further still, the self-aligned nitrogen-implant 22 of FIG. 4 can be carried out with a single source of implant energy and dosage which is unlike some prior art processes that use multiple implant energies and multiple doses.

Moreover, the self-aligned nitrogen-implant 22 of FIG. 4 has deeper penetration, relative to prior art processes, created by higher implant energy and more dopant dose; for example, $3.6 \times 10^{12} cm^{-2}$, dose of nitrogen atoms at an implant energy of 70 keV into the n-channel regions of layer 14B not underneath p+ gate element region 16A. This deeper penetration beneficially enables (a) minimization of vertical electric fields along the surface (particularly at the drain end electrode) of a JFET, (b) improved immunity of the JFET from charge trapping occurring along the top of the WET surface while at the same time (c) maximizing the peak operating voltages of the JFET relative to shallower self-aligned implants of a comparable nitrogen implant dose. These benefits of the present invention, yielded by the method of the present invention, over the products of prior art processes are to be further described hereinafter with reference to FIGS. 21-23.

It should now be appreciated that the present invention provides a foundation element 26, shown in FIG. 7, upon which further processing steps, to be further described with reference to FIGS. 8-20, may be performed so as to provide semiconductor devices, e.g., JFETs having durable and electrical functionality at extremely high temperatures. The foundation semiconductor device of FIG. 7 and additional fabricating steps performed thereon, may be further described with reference to FIG. 8.

Figure 8:
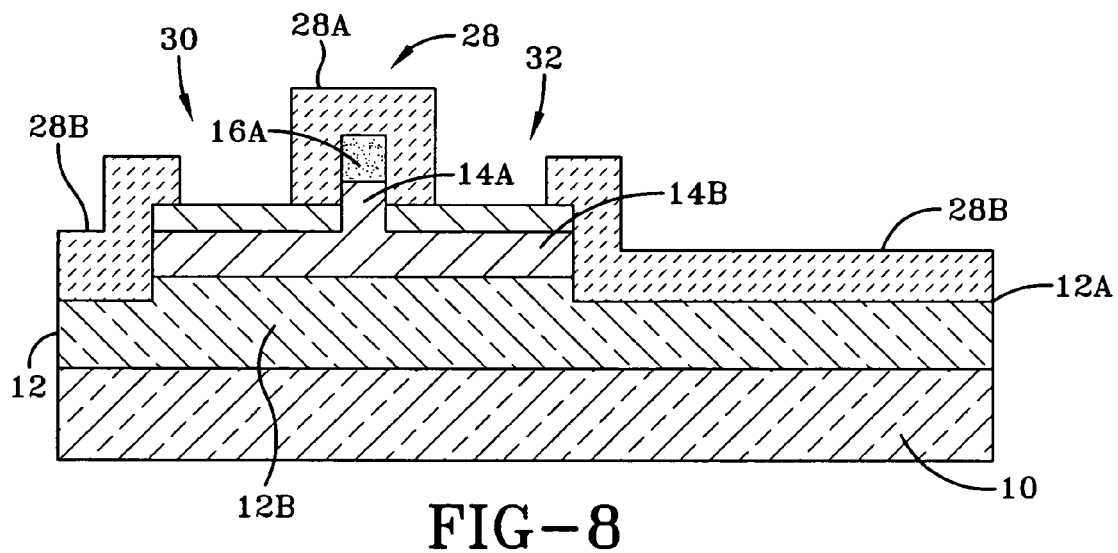
FIG. 8 illustrates a deposition and patterning of a third masking layer for source/drain implant-screening, preferably formed of a silicon material, onto the device of FIG. 7.

FIG. 8 shows the schematic cross-section of the foundation element 26 of FIG. 7 as having deposited thereon an implant-masking layer 28, preferably comprised of silicon material and having a thickness of about 0.6 to 1 micrometers. The implant-masking layer 28 has a central region 28A and a side regions 28B. The implant-masking layer 28 is deposited and patterned using conventional techniques known in the art, so as to cover almost all of the top surface except for JFET source and drain electrode regions 30 and 32. The formation of source and drain electrodes 30 and 32 may be further described with reference to FIG. 9.

Figure 9:
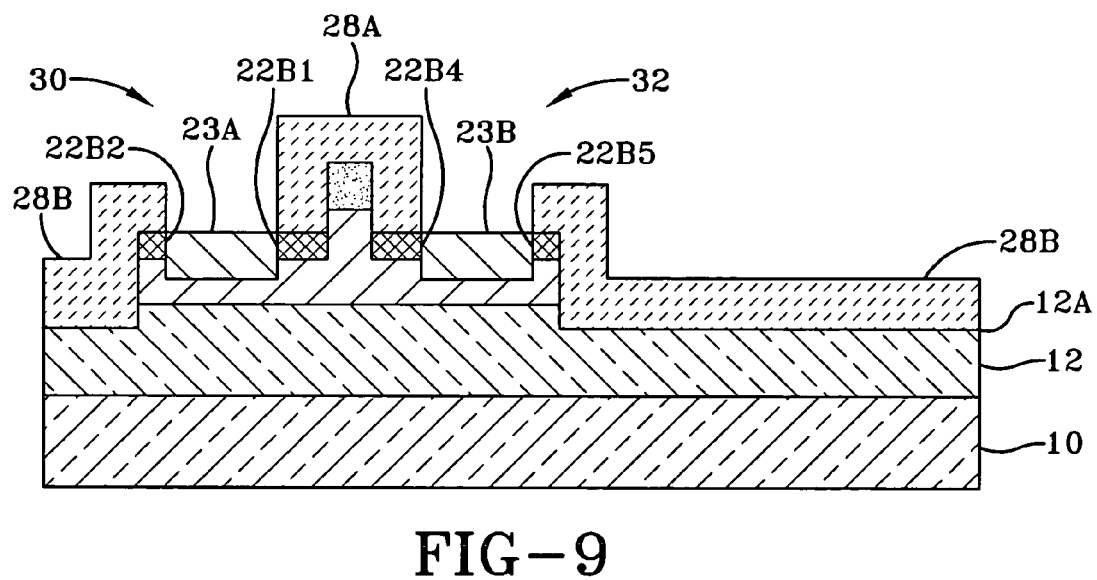
FIG. 9 illustrates the device of FIG. 8 as having a source and drain ion implants deposited therein.

FIG. 9 shows the formation of electrode 30 serving as a source electrode and electrode 32 serving as a drain electrode. The patterned source and drain electrodes 30 and 32 are provided by patterned ion implantation, wherein the pattern is provided using the implant masking layer 28 with more specifically an implanted region 23A assigned to electrode 30 and 23B, assigned to electrode 32. The patterned ion implant 23 is herein termed an n-type electrode ion implant that is patterned by masking layer 28.

The source and drain ion implant 23A and 23B may be accomplished by commercially available ion implantation equipment, or by purchasing ion implantation service from a commercial service vendor such as Implant Sciences Corporation of Wakefield, Mass. The ion implant is provided so that n-type doping level of about $10^{20} cm^{-3}$ is achieved. In order for a JFET to be formed and function as known in the art, these implanted electrodes 30 and 32 reside on opposite sides of the p+ gate 20 and are implanted (i.e., connected to) the n-channel on opposite sides of the p+ gate 20. High doping level at the top surface of electrodes 30 and 32 is desired to assist easier formation of metal contacts to these regions 30 and 32, to be described later with respect to FIGS. 12, 13, and 14. For the case of transistors implemented in the polytypes of SiC, preferably the ion implants for source and drain electrodes 30 and 32 respectively, are nitrogen implanted at an elevated temperature of about 600° C. The device of FIG. 9 is then stripped of its ion implant-masking layer 28 by conventional techniques with the resulting device shown in FIG. 10.

Figure 10:
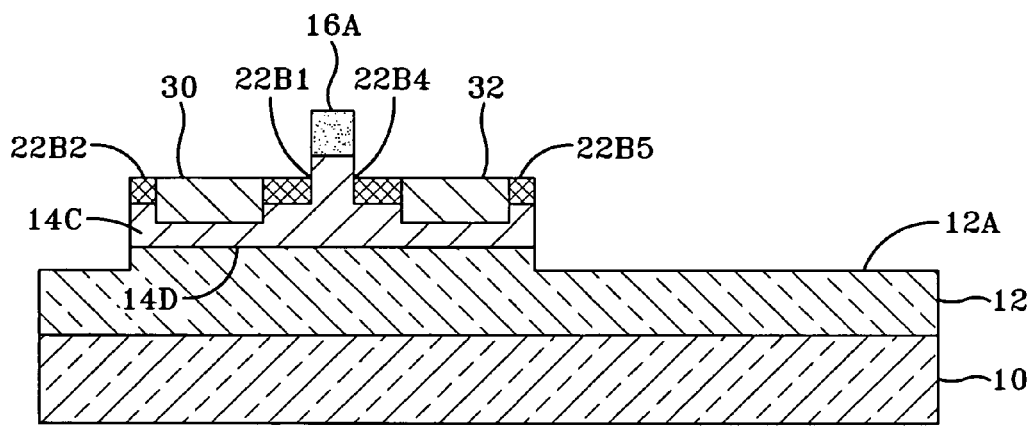
FIG. 10 illustrates the device of FIG. 9 as having been stripped of its source/drain implant-screening third masking layer.

The stripped device of FIG. 10 is then in annealed at a high temperature, preferably a temperature of 1,000° C. to 1,400° C. for the case of nitrogen implanted in to SiC, so as to activate the ion implants embodied in the source and drain electrodes 30 and 32 respectively. As is known in the art, the use of temporary capping layers, annealing crucibles, and or growth precursor environments (such as silane environments for SiC) may be used to minimize possible degradation of the semiconductor surfaces during high temperature ion implantation activation annealing. As most clearly seen in FIG. 10, the device thereof has portions 22B1 and 22B2 of self-aligned nitrogen-implant portion 22B associated with electrode 30 and portions 22B4 and 22B5 are associated with electrode 32. The annealed device of FIG. 10 is further fabricated and which may be further described with reference to FIG. 11.

Figure 11:
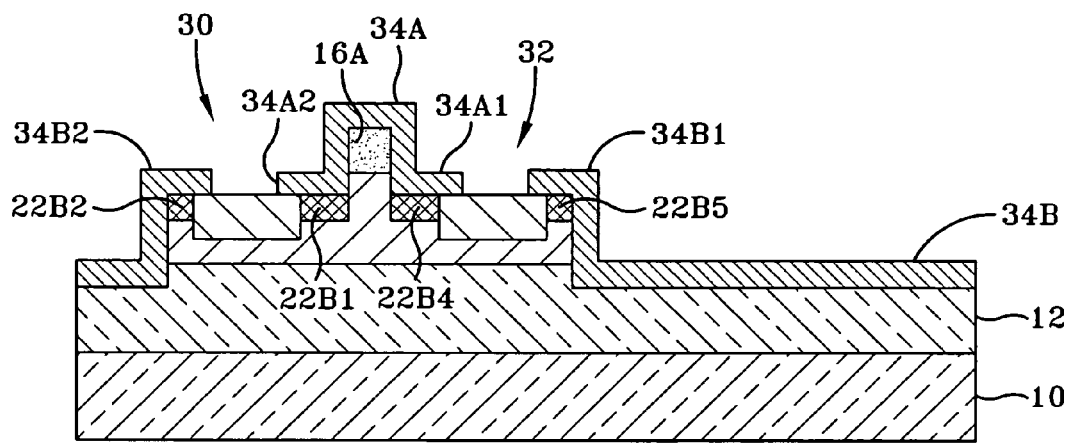
FIG. 11 illustrates the device of FIG. 10 as having a dielectric layer (or layers) deposited thereon with via holes patterned into the dielectric layer (or layers).

FIG. 11 illustrates that the device of FIG. 10 with a patterned first dielectric insulating layer 34 added thereon preferably comprised of $SiO_2$. In some embodiments the $SiO_2$ may be created by thermal oxidation of SiC known in the art. In other embodiments, the $SiO_2$ is deposited by conventional $SiO_2$ deposition methods and equipment known in the art. In other embodiments obvious to those skilled in the art, first dielectric layer 34 may consist of other suitable dielectric materials known in the art, such as $Si_3N_4$, $Al_2O_3$, or other suitable materials that exhibit sufficiently insulating properties at desired operating temperatures. In yet another embodiment obvious to those skilled in the art, first dielectric layer 34 may consist of multiple layers of different dielectric insulating materials. The first insulating dielectric 34 layer first covers the entire top surface of the device, except for via holes that are patterned by photolithographic processing (known in the art) that enable electrical contacts to be subsequently made by metalizations (to be described) to the JFET electrodes, For example, FIG. 11 cross-section shows where first dielectric layer 34 has been removed from regions overlying implanted source electrode 30 and implanted drain electrode 32.

In the cross-sectional schematic of FIG. 11, the insulating dielectric 34 has an inner region 34A and outer regions 34B. The outer region 34B has lip portions 34B1 and 34B2. The lip portion 34B1 covers an outer edge of electrode 32 as well as outer portion 22B5 of the self-aligned nitrogen-implant 22B. Similarly, the lip portion 34B2 also covers an outer edge portion of electrode 30 and the outer edge portion 22B2 of the self-aligned nitrogen implant portion 22B. Further, the inner portion 34A of the insulating dielectric layer 34 has lipped portions 34A1 and 34A2 that respectively cover the edge portions of drain electrode 32 and source electrode 30. In addition, the insulating dielectric layer 24 has a portion 34A which covers the first and second elements 14A and 16A associated with the p+ gate region 20. The device of FIG. 11 is further subjected to fabrication steps, which may be described with reference to FIG. 12.

Figure 12:
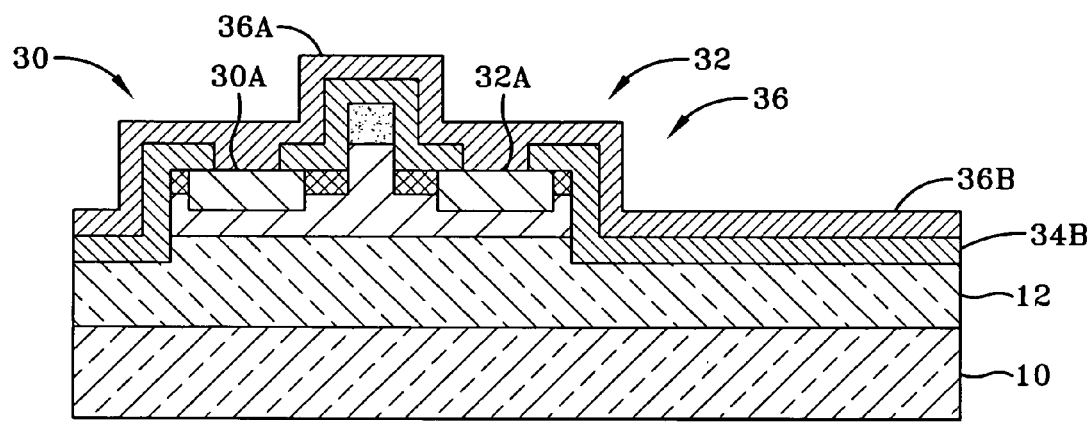
FIG. 12 illustrates the device of FIG. 11 and as having deposited thereon an ohmic contact metallization layer (or layers), wherein electrical contact to the source and drain ion implanted SiC is made where patterned, via holes, in the dielectric permit intimate contact of the implanted SiC and the ohmic contact metallization layer.

FIG. 12 shows the source electrode 30 as having a via-exposed region 30A and, similarly, the drain electrode 32 as having a via-exposed region 32A. FIG. 12 further shows the via-exposed regions 30A and 32A, as well as all of the first dielectric insulating layer 34, as having deposited thereon an ohmic contact metal 36 having a central region 36A and an outer region 36B. The desired placement of the ohmic contact metal layer 36 is obtained by first masking and etching the thermal layer 34 creating the central regions 30A and 32A, as was described with respect to FIG. 11, and then depositing the ohmic contact metal layer 36, which is preferably comprised of $Ti/TaSi_2/Pt$ metallization layers. This contact metal layer may be deposited as described in the prior art technical article of Okojie et al (R. S. Okojie, D. Lukoo, Y. L. Chen, and D. J. Spry, "Reliability Assessment of $Ti/TaSu_2/Pt$ Ohmic Contacts on SiC After 1000 h at 600° C.," Journal of Applied Physics, vol. 91, no. 10, pp. 6553-9559, 2002. Other metallization schemes may also be employed, so long as they are able to function reliably at desired high temperature for desired prolonged operating times. The device shown in FIG. 12 is further fabricated and which may be further described with reference to FIG. 13.

Figure 13:
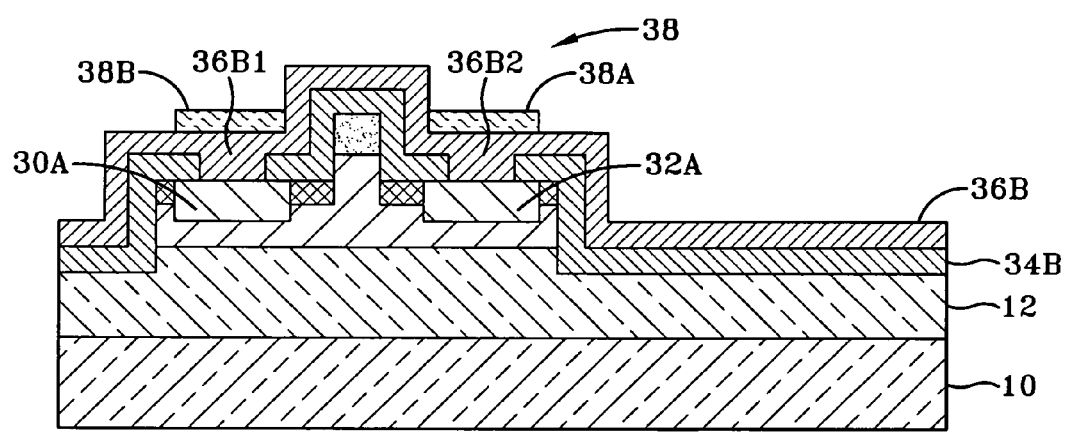
FIG. 13 illustrates the device of FIG. 12 after further depositing and patterning a fourth mask layer for defining where the ohmic contact metal layer (or layers) will be preserved during a subsequent etching process.

FIG. 13 shows a patterned contact masking layer 38, preferably made of aluminum having portions of 38A and 38B as being deposited and patterned on selected portions of the central region of ohmic metal layer 36 that overlay via exposed regions 30A and 32A illustrated in FIG. 12. The deposition and photolithographic patterning of such layers is known in the art, using either a patterned etch process or a liftoff process both of which are known in the art. More particularly, FIG. 13 shows the patterned contact masking layer 38, preferably comprised of aluminum, has portions 38A and 38B, respectively deposited on the central regions 36B2 associated with source electrode 30 and the central region 36B1 associated with drain electrode 32. The device of FIG. 13 is further fabricated and may be further described with reference to FIG. 14.

Figure 14:
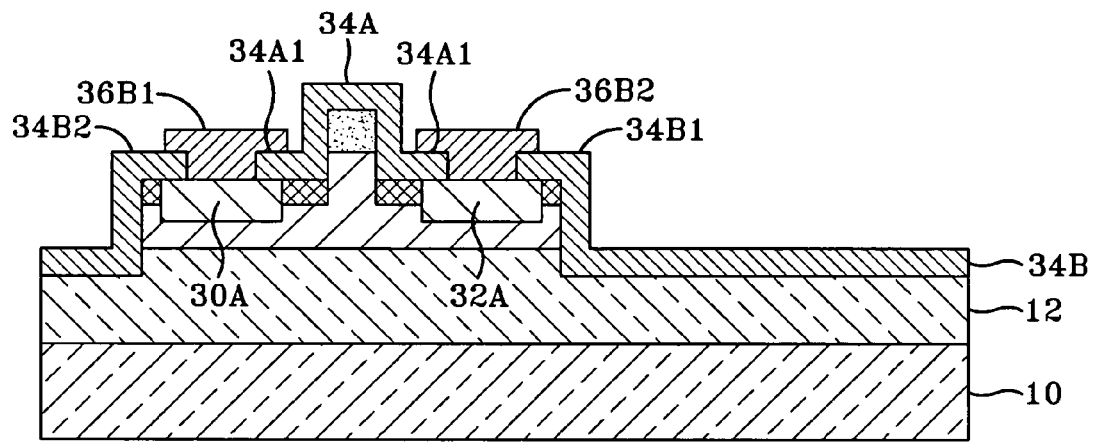
FIG. 14 illustrates the device of FIG. 13 as following etching that removes areas of the ohmic metal contact layer (or layers) that were not residing beneath the patterned fourth mask layer and also as following subsequent removal of the fourth mask layer.

FIG. 14 shows the device following etching that removes ohmic metal layer 36 in all regions except those protected by the patterned contact masking portions 38A and 38B shown in FIG. 13 and subsequent removal of contact masking layer portions 38A and 38B. This leaves behind contact metal region 36B1 that contacts the source electrode implant in central region 30A and contact metal region 36B2 that contacts the drain electrode implant in central region 32A. The device of FIG. 14 is further fabricated and may be further described with reference to FIG. 15.

Figure 15:
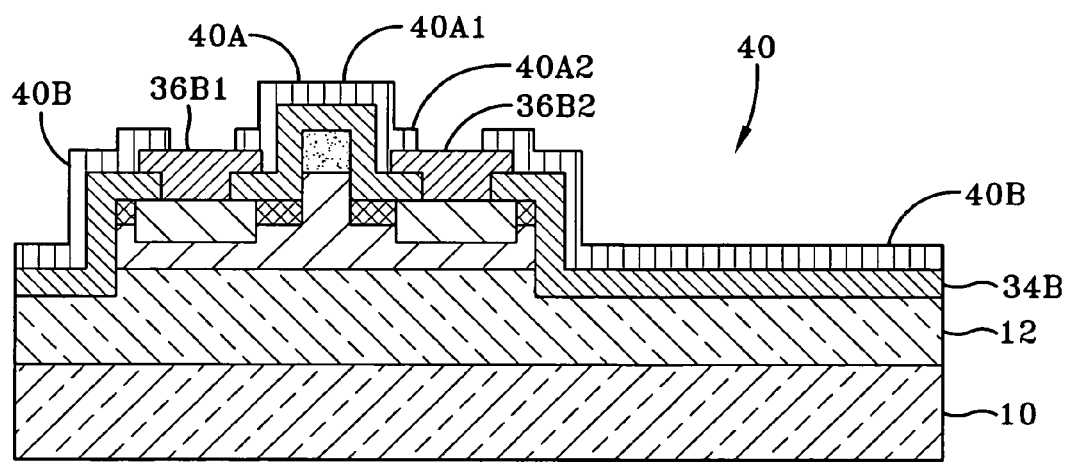
FIG. 15 illustrates the device of FIG. 14 as having a second dielectric insulating layer (or layers) deposited and patterned etched, via holes through certain regions of this dielectric insulating layers(s).

FIG. 15 illustrates the device thereof as having deposited thereon a patterned second dielectric insulating layer 40, preferably comprised of silicon nitride insulator about 1 micrometer in thickness. The layer 40 is first deposited on all of the elements 34, 36B1 and 36B2, and then photolithography is used to protect all second dielectric insulating layer regions except portions above 36B1 and 36B2 from subsequent etching. The regions above 36B1, and 36B2 are then etched to form vias in these regions, so as to provide the arrangement shown in FIG. 15. In other embodiments obvious to those skilled in the art, second dielectric layer 40 may consist of other suitable dielectric materials known in the art, such as $SiO_2$, $Al_2O_3$, or other suitable materials that exhibit sufficiently insulating properties at desired operating temperatures. In yet another embodiment obvious to those skilled in the art, second dielectric layer 40 may consist of multiple layers of different dielectric insulating materials. In FIG. 15 it should be noted that the central portion 40A has a hat like structure having a top portion 40A1 with an upper and lower surface thereon and an extension portion 40A2. The device of FIG. 15 is further fabricated and may be described with reference to FIG. 16.

Figure 16:
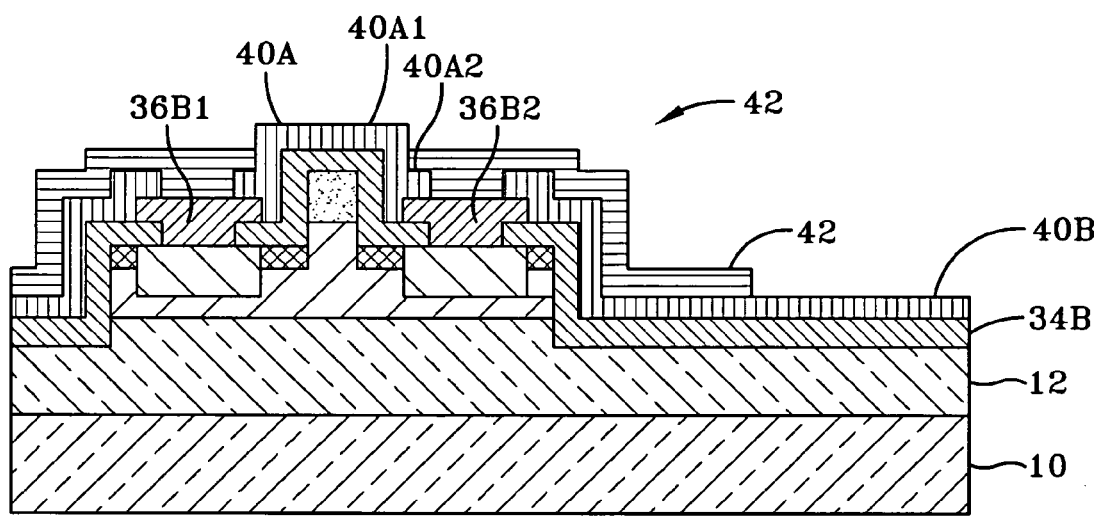
FIG. 16 illustrates the device of FIG. 15 as having a first interconnecting metal layer deposited and patterned thereon.

FIG. 16 illustrates the cross-section of the device of FIG. 15 as having deposited and patterned thereon a first interconnecting metal 42. More particularly from FIG. 16, it should be noted that the metal layer 42 covers some of the side portions 40B, central contact metal regions 36B1 and 36B2, and all of central portion 40A, except for the top surface of hat 40A1, all of which were illustrated in FIG. 15. The deposition and photolithographic patterning of metal layers that can serve as interconnecting metal is known in the art, using either a patterned etch process or a liftoff process both of which are known in the art. The arrangement of layer 42 of FIG. 16 is achieved by first depositing layer 42 and patterned etching to remove the metal layer 42 from desired regions such as the top surface of the hat 40A1. The device of FIG. 16 is further subjected to additional fabrication steps, which may be further described with reference to FIG. 17.

Figure 17:
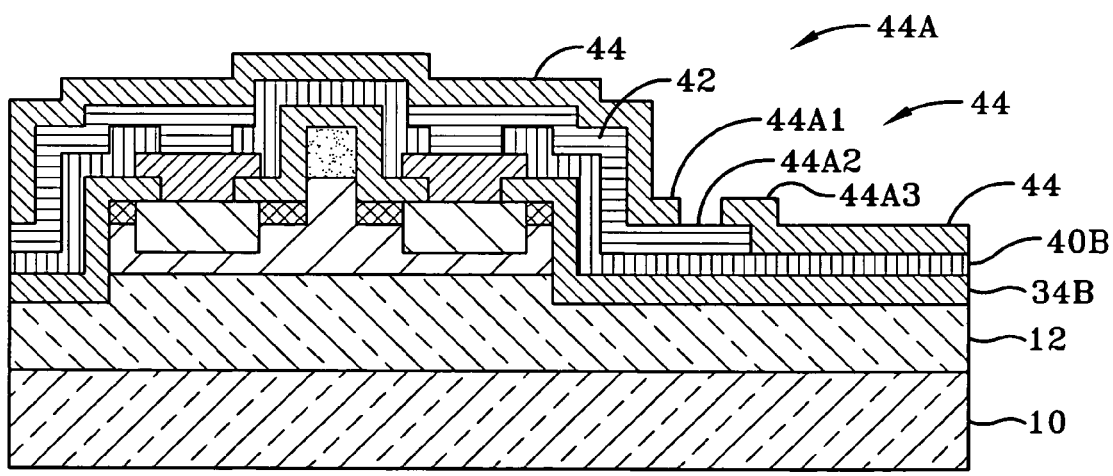
FIG. 17 illustrates the device of FIG. 16 as having a dielectric insulating layer (or layers) deposited and patterned etched of via holes through certain regions of this dielectric insulating layers(s).

FIG. 17 illustrates the cross-section of the device thereof as having deposited thereon a patterned third dielectric insulating layer 44, preferably comprised of silicon nitride insulator about 1 micrometer in thickness. The third dielectric layer 44 is first deposited on all of the elements and then photolithography is used to protect all regions except where contact vias, such as region 44A2 of FIG. 17, to enable subsequent electrical connection between first metal interconnecting metal 42 and second metal interconnecting metal (to be described with respect to FIG. 18) are desired. The vias, such as region 44A2, in the third dielectric insulating layer 44 are then etched to, so as to provide the arrangement shown in FIG. 17. In other embodiments obvious to those skilled in the art, third dielectric layer 44 may consist of other suitable dielectric materials known in the art, such as $SiO_2$, $Al_2O_3$, or other suitable materials that exhibit sufficiently insulating properties at desired operating temperatures. In yet another embodiment obvious to those skilled in the art, third dielectric layer 44 may consist of multiple layers of different dielectric insulating materials.

FIG. 17 shows that the device of FIG. 16 now has an additional insulating dielectric layer 44 thereon. More particularly, the layer 44 is of an insulating dielectric layer that has a lip portion 44A having inner 44A1, middle 44A2 and outer 44A3 regions. Further, the layer 44 of FIG. 17 is provided by first applying an insulating dielectric layer 44, so as to cover all of layers 42 and the top surface of hat 40A1. The device of FIG. 17 is then masked and etched, so as to provide for the middle region 44A2. The device of FIG. 17 is further fabricated and may be described with reference to FIG. 18.

Figure 18:
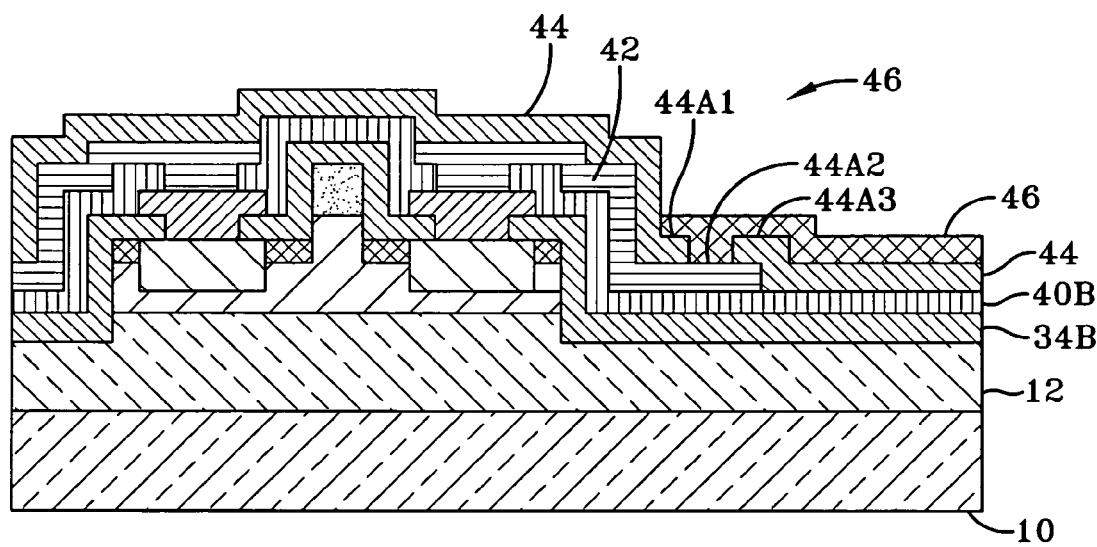
FIG. 18 illustrates the device of FIG. 17 as having a second interconnecting metal layer deposited and patterned thereon.

FIG. 18 shows that portions of the third dielectric layer 44 and via 44A2, are covered with a second interconnecting metal 46. The patterned via 44A2 whose formation was described above with respect to FIG. 17 enables, when desired by circuit design needs, electrical connection between first interconnect metal 42 and second interconnect metal 46. Using first and/or second interconnect metals to electrically connect multiple JFET transistors residing across substrate 10, integrated circuits can thus be formed using this process in a manner known in the art. The device of FIG. 18 is subjected to further fabrication steps, which may be described with reference to FIG. 19.

Figure 19:
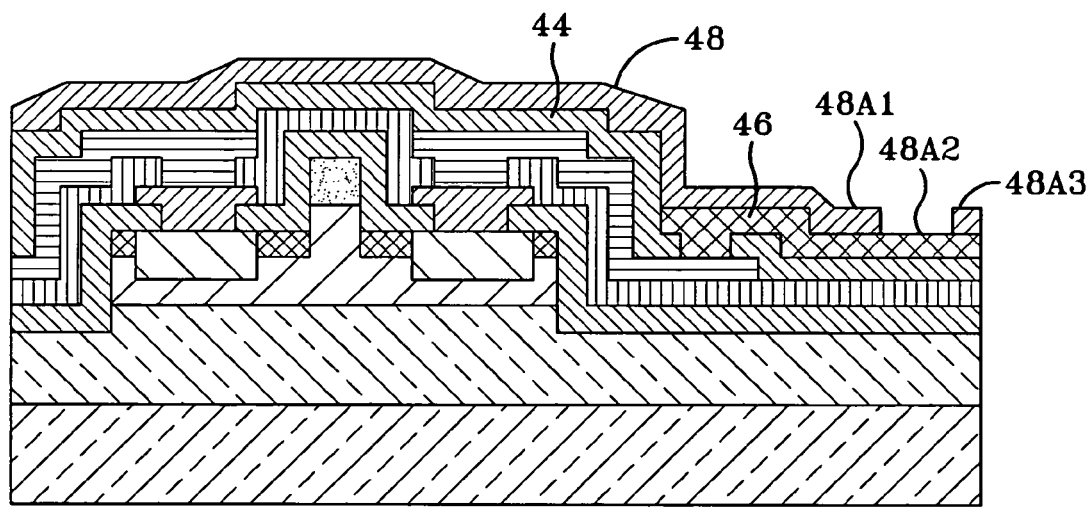
FIG. 19 illustrates the device of FIG. 18 as having a final dielectric insulator passivation layer (or layers) deposited and patterned etched, via holes through certain regions of this passivation layers(s).

FIG. 19 illustrates the cross-section of the device thereof as having deposited thereon a patterned fourth dielectric insulating layer 48, preferably comprised of silicon nitride insulator about 1 micrometer in thickness. The fourth dielectric layer 48 is first deposited on all of the elements and then photolithography is used to protect all regions except where vias, such as region 48A2 of FIG. 19, to enable subsequent electrical connection to the second metal interconnect 46 and bonding metal (to be described with respect to FIG. 20). The vias, such as via 48A2, in the fourth dielectric insulating layer 48 are then etched so as to provide the arrangement shown in FIG. 19. In other embodiments obvious to those skilled in the art, fourth dielectric layer 48 may consist of other suitable dielectric materials known in the art, such as $SiO_2$, $Al_2O_3$, or other suitable materials that exhibit sufficiently insulating properties at desired operating temperatures. In yet another embodiment obvious to those skilled in the art, fourth dielectric layer 48 may consist of multiple layers of different dielectric insulating materials. The fourth insulating layer 48 has a lip region 48A which, in turn, has inner, middle, and outer regions 48A1, 48A2, and 48A3. The device of FIG. 19 is further fabricated and may be described with reference to FIG. 20.

Figure 20:
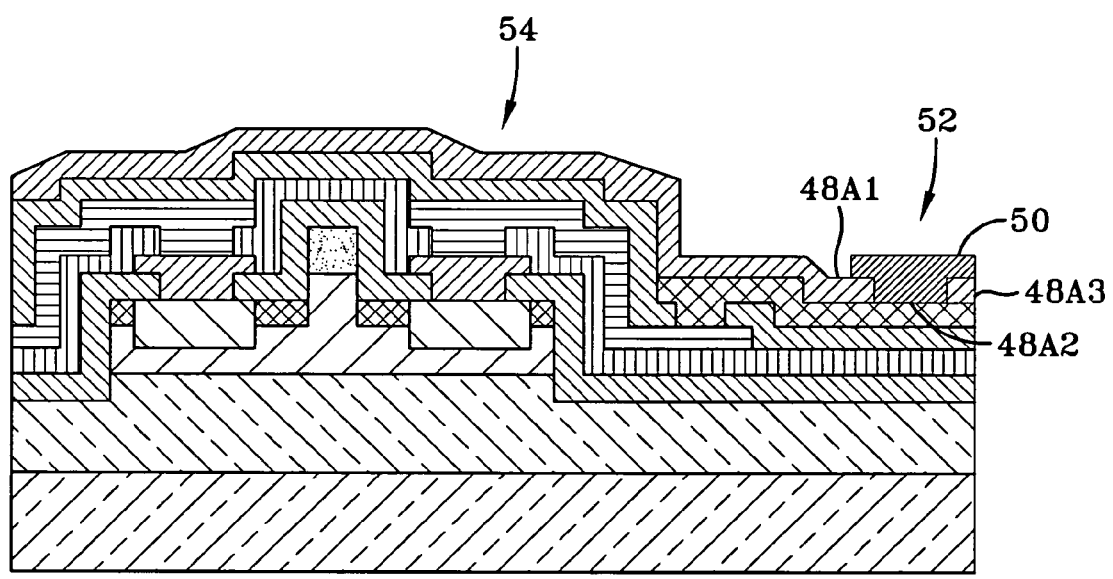
FIG. 20 illustrates the device of FIG. 19 as having a bond pad metal layer placed thereon.

FIG. 20 shows an additional bonding pad layer 50, which covers via regions 48A1, that facilitates electrical connection with second interconnect metal 46. The bonding metal establishes a bonding pad 52 suitable for making electrical connection to a high temperature electronic chip package. In some embodiments, such as described in the technical article of L. Y. Chen, et al, entitled "Packing of Harsh Environment MEMS Devices" contained in the MEMS Handbook (Second Edition 2006) published by CRC Press, Coca Raton, Fla., bonding pad 52 is bonded to gold wire in a manner known in the art that carries electrical signals from the bondpad to the chip package. The structure shown in FIG. 20 is generally identified with reference 54, which is a device, e.g., JFET produced by the practice of the present invention.

It should now be appreciated that the practice of the present invention provides for a JFET semiconductive device 54 having embodied therein self-aligned nitrogen-implant 22. The benefits of this JFET 54 having the self-aligned implant 22 over prior art devices, may be further described with reference to FIGS. 21-23.

Figure 21:
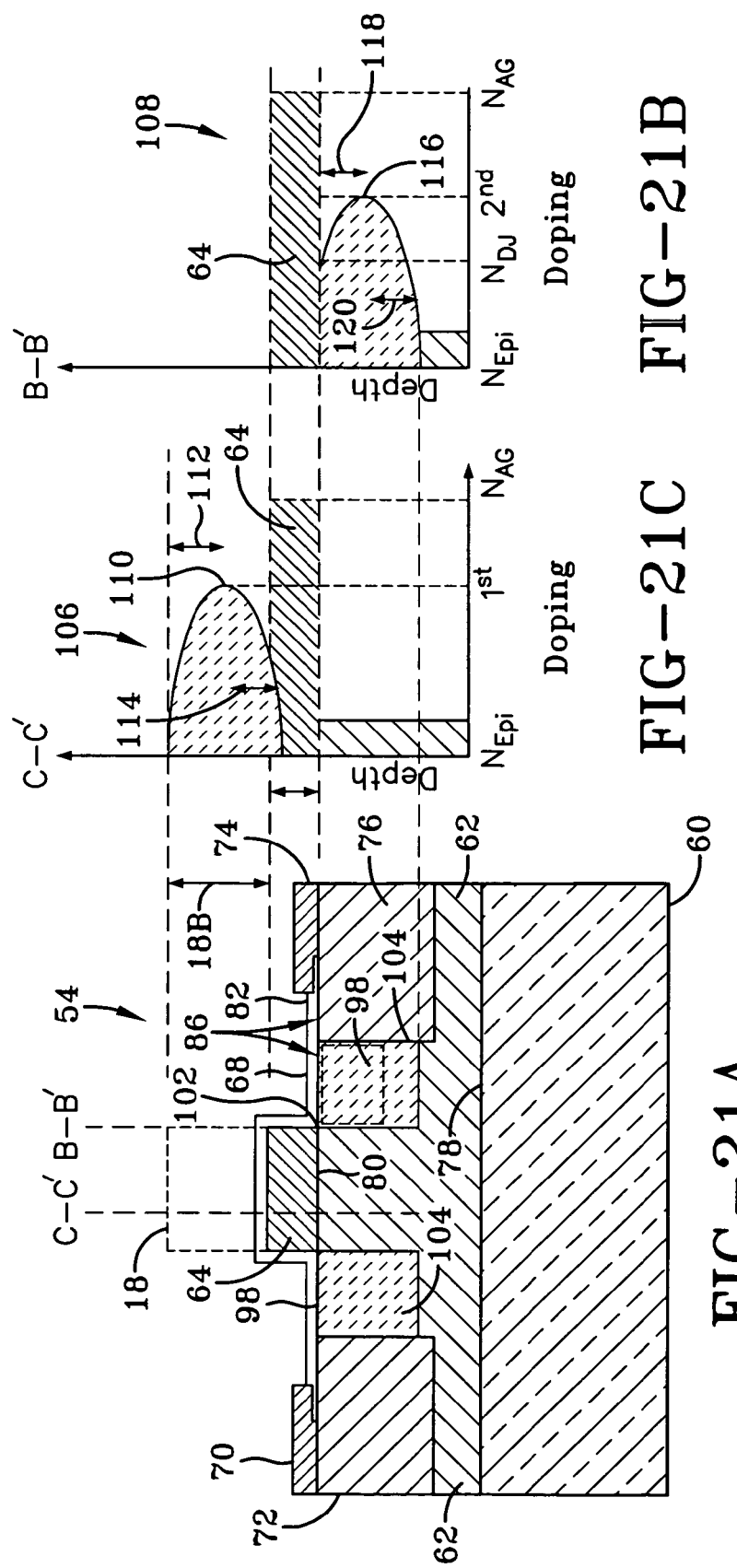
FIG. 21 is composed of FIGS. 21A, 21B and 21C cumulatively shows a simplified schematic cross-section of a JFET fabricated in accordance with the practice of the present invention.
Figure 22:
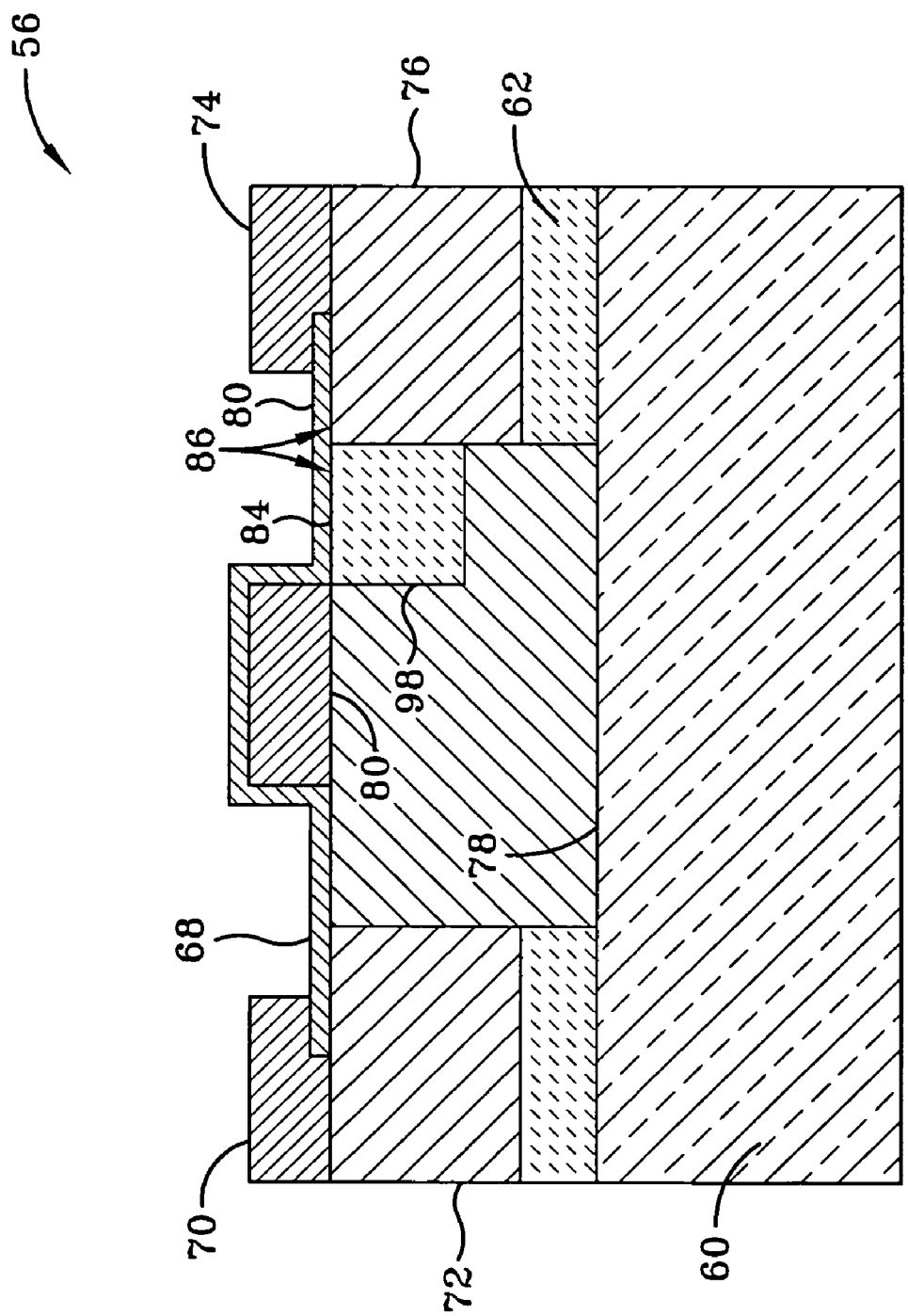
FIG. 22 illustrates a simplified schematic cross-section of a prior art JFET not having the benefits of the present invention.

FIG. 21, comprised of FIGS. 21A, 21B, and 21C shows a simplified schematic cross-section of a JFET 54 fabricated in accordance with the principles of the present invention, while FIGS. 22 and 23 comprised of FIGS. 23A, 23B and 23C, respectively illustrate the simplified schematic cross-sections of JFETs 56 and 58 having the shortcomings of the prior art processes with respect to devices 56 and 58 operations.

JFET devices 54 and 56 and 58 each has a p(−) epitaxial layer 60 (same as 12B in FIG. 7A), and a n-channel epitaxial layer 62 (same as 14B in FIG. 7A), a p+ epitaxial layer gate region 64 (same as 16A in FIG. 11), a dielectric element 68 (same as 34A in FIG. 11), a source contact 70 (same as 36B1 in FIG. 14), a source implant 72 (same as 30A in FIG. 14), a drain contact 74 (same as 36B2 in FIG. 14), and a drain implant 76 (same as 32A in FIG. 14). A channel-to-substrate p-n junction 78 (same as 13A in FIG. 6A) is formed by the junction of the p(−) epitaxial layer 60 and n-epitaxial channel layer 62, while a gate-to-channel p-n junction 80 (same as 11B in FIG. 6A) is formed by the junction of the p+ epitaxial layer gate 64 and the n-epitaxial channel layer 62.

Because the drain implant 76 of the n-channel JFET devices 54, 56 and 58 is operated at positive voltage, some injection (and trapping) of electrons into the dielectric layer 68 on the SiC surface 82 of JFET devices 54, 56 and 58 occurs between the p+ gate region 64 and positively biased drain contact 74. This injection and trapping of negatively-charged electrons is anticipated under operation at high temperature of all the JFET devices 54, 56 and 58. In particular, mobile electrons will be attracted to the SiC dielectric interface near the drain contact 74 by both the positive drain voltage and the pn junction electric field of the reverse biased substrate channel p-n junction 78. The buildup of negative charge in this region of the dielectric, (i.e., near the SiC dielectric interface between the p+ gate region 64 and drain contact 74) forms depletion region 98 and trapped charge region 86.

With first reference to FIG. 22, it is seen that this prior art JFET 56 does not have a self-aligned nitrogen-implant. Because of the lacking self-aligned nitrogen-implant, the negative interface charge in region 86 that builds up with operating time at high temperature disadvantageously increasingly and forms (via well-known electrostatic repulsion) depletion region 98 in the underlying doped channel. It is known in the art that such depletion regions 98 are mostly devoid of mobile carriers that carry current in majority carrier devices such as JFETs. In other words, the mobile electrons that carry current for the JFET 56 are repelled from the fixed negative charge 86 built up in the dielectric element 68, which results in depletion region 98 in the epitaxial n-channel 62 between the edge of the gate region 64 and drain implant 76. It is known in the art that each negatively charged electron trapped in the dielectric, such as dielectric element 68, will correspondingly remove a current carrying mobile electron from the n-channel region 62 underlying thereof and increasing the downward penetration extent of depletion region 98. The reduction of mobile carriers in the n-layer 62 in the region underneath the negative interface charge region 86 in turn increases the resistance of the n-layer region, which undesirably decreases the current and gain of JFET. This effect can be somewhat mitigated by the addition of a shallow self-aligned implant 84 as depicted in FIG. 23.

By providing extra electrons to the n-layer, the extra n-type channel dopant provided by the shallow self-aligned implant 84, shown in FIG. 23A decreases the resistance of the n-layer carrying current in the region between the p+ gate region 64 and the drain contact 74 as well as the drain implant 76. This decrease greatly shrinks the extent of the depletion (and resulting JFET 58 channel resistance change) caused by trapped charge region 86 near the dielectric/SiC interface, that is, depletion region 98. The more n-type dopant that is implanted for the self-aligned implant 84, the less effect the trapped interfacial electron charge region 86 has on the resistance of the JFET 58 channel to advantageously carry current. Thus, the self-aligned n-type implant 84 is important to achieving very stable device operation as negative electron charge gets injected and trapped in the dielectric 68.

FIG. 23B shows a dopant versus depth profile taken through cut-line B-B' of FIG. 23A which, in turn, is through the self-aligned implant 84 region and its intersection with the etched p+ gate 64 as illustrated in FIG. 23A. FIG. 23C shows a dopant versus depth profile 90 taken through the middle of the p+ gate region 64 as illustrated by cut-line C—C' in FIG. 23A. FIG. 23B shows a dopant versus depth profile 92 taken through the cut-line B-B' in FIG. 23A.

As known in the art, ion implantation process adds a peaked, approximately Gaussian (known in the art), dopant versus depth distribution. The implanted n-type dopant versus depth profiles are illustrated (in simplified manner) by the peaks 94 and 96 in the doping shown in plots 99 and 100 of FIG. 23C and FIG. 23B, respectively. It is important to recall that both FIG. 23B and FIG. 23C n-type doping profiles 92 and 90, respectively, are the result of self-aligned ion implantation process with differences, to be described, from the self-aligned process illustrated in FIG. 4 and to be further described with reference to FIG. 21.

As previously mentioned with respect to FIG. 4 and now with reference to FIG. 23, an important requirement of the self-aligned nitrogen implant is that for the region where p+ gate 16A (same as 64) exists that the self-aligned implant 22 not penetrate into the underlying n-type epitaxial layer 62, consistent with the dopant versus depth profile 90 shown for the gate region in FIG. 23C. This imposes an upper limit on the implant depth (proportional to implant energy known in the art) of the self-aligned implant. Thus, the depth of the implant in the region between the gate and drain, whose dopant versus depth profile is illustrated in FIG. 23B is restricted to the relatively shallow depth less than the thickness of the p+ gate 64. Thus, the peaks of the dopant 94 and 96 (shown in FIGS. 23B and 23C, respectively) added by the self-aligned ion implantation 88 in JFET 58 at outline B-B' resides near the SiC surface. As will be described below, it is disadvantageous that the peak n-type dopant concentration occurs very close to the top SiC surface very near corner 102 of the gate-to-channel p+n junction 80.

While it has benefits for stability of device 58 of FIG. 23 described above, the increased implanted dopant for the self-aligned implant 88 at the corner 102 of the pn junction gate (between p+ gate region 64 and epitaxial layer 62) also has the disadvantage of decreasing the breakdown voltage and increasing the leakage of the pn gate junction 80 between the p+ gate region 64 and n-channel epitaxial layer 62. The fact that the breakdown voltage of a p+n junction (such as 80) decreases with increasing doping on the n-side of the junction is well known in the art. A description of this can be found in "The PN Junction Diode", $2^{nd}$, edition by G. W. Neudeck (Reading, Mass.: Addison-Wesley Publishing, 1989) pp 75-82, as well as many other textbooks used in the art. This fact imposes an upper limit on the amount of n-type doping that can be added by the self-aligned implant 98 of JFET 58, in order for the transistor to successfully operate at a desired voltage in a desired (integrated) circuit application. If the dose of the n-type self-aligned implant 98 is made too high in an effort to make the n-type channel more immune from trapped charge 86, the p+n junction 80 will fail at corner 102 at too low of a gate-to-drain voltage for the JFET to be useful.

The present invention embodied by JFET 54, shown in FIG. 21 reduces and even eliminates these drawbacks of prior art devices 56 and 58. FIG. 21A shows the simplified cross-section of the JFET fabricated in accordance with the present invention having deeper self-aligned implant 104. FIG. 21B shows the resulting dopant versus depth profile taken through cut line B-B' of FIG. 21A, more particularly, where the self-aligned implant 104 intersects the edge of the p+ gate region 64. FIG. 21C shows the resulting dopant versus depth profile taken through cut line C-C'. Though not present in the final device 54 of FIG. 21, FIG. 21A shows, in phantom, the etch mask 18, previously described with reference to FIG. 3, having a thickness 18B. In particular, the presence of this etch mask 18 stops the ions implanted during the self-aligned implant from penetrating below the p+ gate region 64, so long as a sufficient thickness 18B of first etch mask 18 is employed. In particular, the thickness of the first etch mask 18 of FIG. 3 should exceed the sum of the expected peak depth 112 of the implant 104 plus the expected straggle 114 (known in the art) of the implant 104, to be further described with reference to FIGS. 21B and 21C.

Due to the presence of the first etch mask 18, as illustrated in FIG. 3 and particularly FIG. 4, the self-aligned implant 104 of JFET 54 provides for deeper insertion of the self-aligned implant 104 (via higher energy implantation) relative to the top surface of epitaxial layer 62 in the region between the gate region 64 and drain implant 74. The ability to perform self-aligned implant 104 significantly, deeper (i.e., with higher energy) as depicted in FIG. 21 relative to that of FIG. 23, and favorably enables lower leakage current and higher operating breakdown voltage of the JFET 54 gate p+n junction 80 to be maintained, while at the same time allowing for increased dose of implanted doping 104 that further improves the immunity of JFET 54 to resistance change caused by electron interfacial charge trapping 86 in the dielectric element 68.

FIGS. 21C and 21B illustrates dopant versus depth profiles 106 and 108, respectively. FIG. 21C illustrates a first peak doping 110, a first peak depth 112 and a first straggle 114 into the p+ gate region 64 that occurs along cross-section C—C'. Similarly, FIG. 21B illustrates a second peak doping 116, a second peak depth 118, and a second peak straggle 120 into the n-epitaxial layer 62 that occurs along cross-section B-B'.

As illustrated by comparing FIG. 21B to FIG. 23B, the peak 116 of the profile 108 of FIG. 21B of the implanted n-type dopant near corner 98 is located significantly deeper for JFET 54, further from the p+n junction corner 102 than for prior art JFET 58 shown in FIG. 23B by way of peak 96 of profile 92. This movement of the peak from that of FIG. 23B to that of FIG. 21B, allows for more total dopant (i.e., dose, proportional to the area under the doping vs. depth profile) to be implanted before the n-type doping level at p+n junction 80 (graphically illustrated as $N_{DJ}$ in FIG. 21B and FIG. 23B) at corner 102 exceeds a value needed to maintain desired JFET operating voltage (i.e., drain-to-gate breakdown voltage). Since more implanted dopants are available to counteract the charge 86 that gets trapped in the dielectric element 68 during device operation, the device of FIG. 21 may operate with greater high temperature stability than the device of FIG. 23. Thus, this implementation of the present invention of the deeper self-aligned implant 104 of FIG. 21 with correspondingly higher self-aligned implanted dose for the same JFET peak operating voltage, realizes the best tradeoff of high temperature device stability and JFET peak operating voltage.

With reference to both FIGS. 21B and 21C, the self-aligned implant 104 of n-type dopant has (1) a first peak doping 110 (2) a first peak depth 112, and (3) a first straggle 114 into the p+ gate region 64. The self-aligned implant 104 further has (4) a second peak doping 116 (5) a second peak depth 118, and (6) a second straggle 120 into the n-type epitaxial layer of n-type wide band gap material located beneath the exposed n-type wide band gap material surface, wherein the sum of the first peak depth 112 plus the first straggle 114 is less than the sum of the p+ thickness of the gate region 64 and the first masking layer 18 thickness 18B. The first peak doping 110 being less than 50% of the p+ doping density of the highly conductive first epitaxial layer 16 of FIG. 4 (layer patterned to form gate 64 of FIG. 21) of highly conductive p+ type wide band gap material. The p-type doping density of layers 16 (same as 64) is shown in FIGS. 21B and 21C by the symbol $N_{AG}$. Further, the second peak doping 116 is greater than twice the n-type epilayer 14 (same as 62) doping density that is shown in FIGS. 21B and 21C by the symbol $N_{Epi}$. Note that because first peak doping 110 and second peak 116 doping are accomplished simultaneously via the same ion implantation step (with same dose and same implantation energy), bounds with both upper and lower limits for both the first and second peaks 110 and 116, respectively, dopings are automatically imposed by the combination of the abovementioned respective restrictions to first peak doping 110 and second peak doping 116.

In the practice of the present invention JFET devices 54 were electrically operated continuously at least 500° C. for over 10,000 hours in an air ambient with less than a 10% change in operational transistor parameters, such as threshold voltage, saturation current, transconductance, and drain-to-source resistance.

It should now be appreciated that the practice of the present invention provides a foundation element 26 shown in FIG. 7 upon which further fabrication steps, shown in FIGS. 8-20, are performed to produce a JFET 54, shown in FIGS. 20 and 21, having durable and stable electrical functionality of high temperature transistors and integrated circuits. The JFET 54 may be electrically operated continuously at least 500° C. for over 10,000 hours in an air ambient with less than a 10% change in operational transistor parameters.

The invention has been described with reference to preferred embodiments and alternates thereof. It is believed that many modifications and alterations to the embodiments as described herein will readily suggest themselves to those skilled in the art upon reading and understanding the detailed description of the invention. It is intended to include all modifications and alterations insofar as they come within the scope of the present invention.

What I claim is:

1. A process for forming a foundation element for semiconductor devices comprising the steps of:
   a) providing a wafer of single-crystal wide band gap material serving as a substrate;
   b) growing a first epitaxial layer of p-type wide band gap material on said substrate with a p doping density less than about $2\times10^{17} cm^{-3}$;
   c) growing a first epitaxial layer of n-type wide band gap material on top of said first epitaxial layer of p-type wide band gap material with n-type wide band gap material epilayer having a predetermined doping density, which exceeds twice said p doping density of said first epitaxial layer of p-type wide band gap material and with a preselected n-type epilayer thickness, wherein said n-type epilayer doping density and said n-type epilayer thickness are selected to provide a desired junction field effect transistor threshold voltage;
   d) growing a first epitaxial layer of a highly conductive p+ type wide band gap material of p+ thickness which is less than said preselected n-type epilayer thickness, said first epitaxial layer of p+ type wide band gap material having a p+ doping density selected to be greater than twice said n-type epilayer doping density of wide band gap material, said growing of said first epitaxial p+ type wide band gap material being on top of said first epitaxial layer of n-type wide band gap material;
   e) depositing and patterning a first masking layer of a predetermined thickness on top of said first epitaxial layer of highly conductive p+ type material so as to form a first element of a p+ gate region;
   f) etching so as to (1) remove all of said first epitaxial layer of said highly conductive p+ type wide band gap material, except for a portion laying under said first masking layer so as to form a second element of said p+ gate region with said second element of said p+ gate region having a top surface, said etching also (2) removing a portion of the top surface of said epitaxial layer of said first epitaxial layer of n-type wide band gap material so as to form an exposed n-type wide band gap material surface, said etching also leaving a portion laying under said second element of said p+ gate region that forms a third element of said p+ gate region, wherein said first, second and third elements form said p+ gate region;
   g) performing a self-aligned implant of n-type dopant into a self-aligned implant region that is provided by a union of both of said exposed n-type wide band gap material surface and said first element of said p+ gate region, said self-aligned implant having a region abutting said p+ gate regions and extending outward therefrom, said self-aligned implant of n-type dopant having a (1) first peak doping (2) first peak depth, and (3) first straggle into the said p+ gate region, said self-aligned implant further having (4) a second peak doping (5) a second peak depth, and (6) a peak straggle into said n-type epitaxial layer of n-type wide band gap material beneath said exposed n-type wide band gap material surface, wherein: the sum of said first peak depth plus said first straggle is less than the sum of said p+ thicknesses of the highly conductive p+ type wide band gap material and said first masking layer predetermined thickness; said first peak doping being less than 50% of the said p+ doping density of the said highly conductive first epitaxial layer of highly conductive p+ type wide band gap material; said second peak doping being greater than twice the said n-type epilayer doping density of said first layer of n-type wide band gap material;

h) depositing and patterning a second masking layer having a predetermined thickness on (1) said p+ gate region and (2) said nitrogen-implant region abutting said p+ gate region and extending outward therefrom, i) etching so as to form a n-channel mesa by progressively removing said p+ type, n– type and p– type wide band gap materials to a depth that removes all of the said first epitaxial layer of p+ type wide band gap material and first epitaxial layer n– type wide band gap material except in predetermined regions beneath said first masking layer and said second masking layer.

2. The process according to claim 1 wherein said wide band gap material is comprised of SiC material.

3. The process according to claim 1, wherein
a) said etching for forming said p+ gate region is of a reactive ion type; and
b) said etching for forming said n– channel mesa is of a reactive ion type.

4. The process according to claim 1 further comprising a buffer layer of p+ type material interposed between said substrate and said first epitaxial layer of p+ type material, said buffer layer being grown using a doping level of about $10^{18} cm^{-3}$.

5. The process of claim 2, wherein said self-aligned implant of n-type dopant is a self-aligned implant of nitrogen dopant carried out at a temperature within the range of minus 55° C. (–55° C.) to plus 200° C. (+200° C.).

6. The process according to claim 1, wherein said self-aligned implant of n-type dopant is carried out with a single implant energy and dosage.

7. The process according to claim 2 wherein said n-type dopant has a predetermined doping density is nitrogen and wherein said p-type dopant has a predetermined doping density is aluminum.

8. The process according to claim 1, wherein said self-aligned implant of n-type dopant has an outer region and said first epitaxial layer has a top surface, and wherein claim 1 further comprising the step of removing said first and said second masking layers.

9. The process according to claim 8, further comprising the step of depositing an ion implant screening layer, said deposited ion implant screening layer covering said n-channel mesa and said p+ gate region.

10. The process according to claim 9, further comprising the step of depositing and patterning an n-type electrode ion implant masking layer, wherein said n-type electrode ion implant masking layer and said first epitaxial layer of n-type material each has a first region assigned to a source electrode and a second region assigned to a drain electrode, and wherein claim 9 further comprises performing an ion implant to provide for said source and drain electrodes with a n-type doping level of about $10^{20} cm^{-3}$.

11. The process according to claim 10, wherein said performing an ion implant is a nitrogen implant performed at a temperature of about 600° C.

12. The process according to claim 11, wherein said n-type electrode ion implant masking layer is comprised of silicon.

13. The process according to claim 10, further comprises the steps of:
a) removing said n-type electrode ion implant masking layer and said ion implant screening layer; and
b) annealing said ion implant comprising said source and drain electrodes in a temperature of about 1100-1400° C., so as to activate the deposited ion implant of said source and drain electrodes.

14. The process according to claim 13, wherein (1) said assigned regions of said first masking layer of said source and drain electrodes respectively has inner and outer edge portions abutting said source and drain electrodes and wherein claim 13 further comprises the steps of:
a) depositing and patterning a patterned first dielectric insulating layer upon (1) said inner and outer portions of said first masking layer of said source and drain electrodes and, (2) said second and third elements of said p+ gate region and upon the etched top surface of said first epitaxial layer of said p type material; and
b) depositing on said patterned first dielectric insulating layer and on remaining portions of said source and drain electrodes a metal layer comprised of Ti/TaSi/Pt.

15. The process according to claim 14, wherein said metal layer of Ti/TaSi/Pt has a central region and wherein said claim 14 further comprises the steps of:
a) depositing and patterning an aluminum layer on said central region of said metal layer of Ti/TaSi/Pt;
b) etching regions of said metal layer of Ti/TaSi/Pt not protected by said aluminum layer so as to remove all said Ti/TaSi/Pt not protected by said patterned aluminum layer; and
c) etching said aluminum layer.

16. The process according to claim 15 wherein said source and drain electrodes each has a central and edge regions, and said metal layer of Ti/TaSi/Pt layer has portions laying on the central region of each of said source and drain electrodes and, wherein said first dielectric layer has regions covering the edge regions of said source and drain electrodes and, wherein said claim 15 further comprises the steps of:
a) depositing and patterning a second dielectric insulator layer on said first dielectric layer, said second dielectric insulator layer having a thickness of about 1.1 micrometers and being comprised of $Si_3N_4$ and wherein said second dielectric insulator layer is patterned to be devoid from said central regions of said source electrode and said drain electrode.

17. The process according to claim 16, wherein said first dielectric insulator layer has a central portion and wherein said second dielectric insulator layer has a central portion with a central hat member thereon with a top having upper and lower surfaces and an extension portion, said lower surface of said top laying on the said central portion of said first dielectric insulator layer, and said extension portion laying on central region of said first dielectric insulator layer, and wherein said claim 16 further comprises the steps of:
a) depositing and patterning a first interconnecting metal layer onto (1) the hat of said second dielectric insulating layer, except for the upper surface thereof, (2) the central portion of said layer Ti/TaSi/Pt insulator layer and (3)

the second dielectric insulator layer portions covering said central portion of said metal layer of Ti/TaSi/Pt and said first dielectric insulator layer.

18. The process according to claim 17, wherein said first interconnecting metal layer has a lip portion which, in turn, has inner, middle and outer regions, and wherein said second dielectric insulator layer has outer regions not covered by said first interconnecting metal layer, and wherein claim 17 further comprises the steps of:
   a) depositing a third dielectric insulator layer on (1) said first interconnecting layer, and at said outer regions not covered with said interconnecting layer, and (2) on said second dielectric insulator layer; and
   b) etching said third dielectric insulator layer so as to expose middle region of said lip portion of said first interconnecting layer.

19. The process according to claim 18 further comprising the step of:
   a) depositing a second interconnecting metal layer so as to cover said lip portion of said first interconnecting metal layer.

20. The process according to claim 19 further comprising the step of:
   a) depositing a first passivation layer on (1) said third dielectric insulator layer and (2) on said second interconnecting layer.

21. The process according to claim 20, wherein said first passivation layer has a lip with inner, middle and outer regions, and wherein claim 20 further comprises the steps of:
   a) etching said middle region of said first passivation layer; and
   b) depositing and patterning a bonding metal on said etched middle region of said first passivation layer.

* * * * *